US00RE47440E

(19) United States
(12) Reissued Patent
Yudovsky et al.

(10) Patent Number: US RE47,440 E
(45) Date of Reissued Patent: Jun. 18, 2019

(54) APPARATUS AND METHOD FOR PROVIDING UNIFORM FLOW OF GAS

(71) Applicant: Applied Materials, Inc., Santa Clara, CA (US)

(72) Inventors: Joseph Yudovsky, Campbell, CA (US); Mei Chang, Saratoga, CA (US); Faruk Gungor, San Jose, CA (US); Paul F. Ma, Santa Clara, CA (US); David Chu, Campbell, CA (US); Chien-Teh Kao, Sunnyvale, CA (US); Hyman Lam, San Jose, CA (US); Dien-Yeh Wu, San Jose, CA (US)

(73) Assignee: Applied Materials, Inc., Santa Clara, CA (US)

(21) Appl. No.: 15/678,883

(22) Filed: Aug. 16, 2017

Related U.S. Patent Documents

Reissue of:
(64) Patent No.: 9,109,754
Issued: Aug. 18, 2015
Appl. No.: 13/653,952
Filed: Oct. 17, 2012

U.S. Applications:
(60) Provisional application No. 61/548,942, filed on Oct. 19, 2011.

(51) Int. Cl.
*F17D 3/00* (2006.01)
*F16K 11/20* (2006.01)

(52) U.S. Cl.
CPC ..... *F17D 3/00* (2013.01); *Y10T 137/7833* (2015.04)

(58) Field of Classification Search
CPC ..... C23C 16/455; C23C 16/45565; C23C 16/4558; H01J 37/3244; F17D 3/00; Y10T 137/7833
(Continued)

(56) References Cited

U.S. PATENT DOCUMENTS 4,792,378 A 12/1988 Rose et al.
5,451,290 A 9/1995 Salfelder
(Continued)

FOREIGN PATENT DOCUMENTS

CN 101423936 A 5/2009
CN 101423937 A 5/2009
(Continued)

OTHER PUBLICATIONS

International Search Report, dated Mar. 29, 2013 for PCT/U52012/061022.
(Continued)

*Primary Examiner* — William C Doerrler
(74) *Attorney, Agent, or Firm* — Patterson + Sheridan, LLP

(57) ABSTRACT

Provided are gas distribution apparatus with a delivery channel having an inlet end, an outlet end and a plurality of apertures spaced along the length. The inlet end is connectable to an inlet gas source and the outlet end is connectable with a vacuum source. Also provided are gas distribution apparatus with spiral delivery channels, intertwined spiral delivery channels, splitting delivery channels, merging delivery channels and shaped delivery channels in which an inlet end and outlet end are configured for rapid exchange of gas within the delivery channels.

31 Claims, 21 Drawing Sheets

(58) Field of Classification Search
USPC ..... 137/561 R, 561 A, 597; 156/345.33, 156/345.34; 239/558; 427/479
See application file for complete search history.

(56) References Cited

U.S. PATENT DOCUMENTS

| | | | | |
|---|---|---|---|---|
| 5,500,256 | A * | 3/1996 | Watabe | 427/579 |
| 5,728,223 | A | 3/1998 | Murakami et al. | |
| 5,950,925 | A | 9/1999 | Fukunaga et al. | |
| 6,050,506 | A | 4/2000 | Guo et al. | |
| 6,059,885 | A | 5/2000 | Ohashi et al. | |
| 6,086,677 | A | 7/2000 | Umotoy et al. | |
| 6,090,210 | A | 7/2000 | Ballance et al. | |
| 6,148,761 | A | 11/2000 | Majewski et al. | |
| 6,167,834 | B1 | 1/2001 | Wang et al. | |
| 6,245,192 | B1 | 6/2001 | Dhindsa et al. | |
| 6,289,842 | B1 | 9/2001 | Tompa | |
| 6,302,964 | B1 | 10/2001 | Umotoy et al. | |
| 6,432,831 | B2 | 8/2002 | Dhindsa et al. | |
| 6,620,289 | B1 | 9/2003 | Yan et al. | |
| 6,647,993 | B2 | 11/2003 | Shang et al. | |
| 6,793,733 | B2 | 9/2004 | Janakiraman et al. | |
| 6,821,347 | B2 | 11/2004 | Carpenter et al. | |
| 6,827,815 | B2 | 12/2004 | Hytros et al. | |
| 6,983,892 | B2 | 1/2006 | Noorbakhsh et al. | |
| 7,018,940 | B2 | 3/2006 | Dunham | |
| 7,104,476 | B2 | 9/2006 | Kim | |
| 7,976,631 | B2 | 7/2011 | Burrows et al. | |
| 8,100,082 | B2 | 1/2012 | Chen et al. | |
| 8,328,939 | B2 | 12/2012 | Choi et al. | |
| 8,795,793 | B2 | 8/2014 | Choi et al. | |
| 8,955,547 | B2 * | 2/2015 | Gungor et al. | 137/597 |
| 2001/0027026 | A1 | 10/2001 | Dhindsa et al. | |
| 2003/0124842 | A1 | 7/2003 | Hytros et al. | |
| 2003/0172872 | A1 | 9/2003 | Thakur et al. | |
| 2003/0209323 | A1 | 11/2003 | Yokogaki | |
| 2004/0003777 | A1 * | 1/2004 | Carpenter et al. | 118/715 |
| 2004/0050326 | A1 | 3/2004 | Thilderkvist et al. | |
| 2004/0082251 | A1 | 4/2004 | Bach et al. | |
| 2004/0127067 | A1 * | 7/2004 | Dunham | 438/778 |
| 2004/0182417 | A1 * | 9/2004 | Hamelin | C23C 16/4405 134/1.3 |
| 2004/0216665 | A1 | 11/2004 | Soininen et al. | |
| 2005/0092247 | A1 | 5/2005 | Schmidt et al. | |
| 2005/0092248 | A1 | 5/2005 | Lee et al. | |
| 2005/0133161 | A1 | 6/2005 | Carpenter et al. | |
| 2005/0173569 | A1 | 8/2005 | Noorbakhsh et al. | |
| 2005/0223986 | A1 * | 10/2005 | Choi | C23C 16/4405 118/715 |
| 2005/0255257 | A1 | 11/2005 | Choi et al. | |
| 2006/0021574 | A1 | 2/2006 | Armour et al. | |
| 2006/0021703 | A1 | 2/2006 | Umotoy et al. | |
| 2006/0057824 | A1 | 3/2006 | Araki et al. | |
| 2006/0078483 | A1 | 4/2006 | Kemoun et al. | |
| 2007/0022954 | A1 * | 2/2007 | Iizuka et al. | 118/724 |
| 2007/0119370 | A1 | 5/2007 | Ma et al. | |
| 2007/0240631 | A1 | 10/2007 | Nijhawan et al. | |
| 2009/0056626 | A1 | 3/2009 | Thakur et al. | |
| 2009/0095222 | A1 | 4/2009 | Tam et al. | |
| 2010/0075066 | A1 * | 3/2010 | Ueda et al. | 427/575 |
| 2011/0011338 | A1 | 1/2011 | Chuc et al. | |

FOREIGN PATENT DOCUMENTS

| | | | |
|---|---|---|---|
| JP | 2007-005491 | | 1/2007 |
| JP | 2007005491 | A | 1/2007 |
| JP | 2010135569 | A | 6/2010 |
| JP | 2011-086776 | | 4/2011 |
| JP | 2011086776 | A | 4/2011 |
| KR | 10-2002-0028921 | | 4/2002 |
| KR | 10-2008-0027459 | A | 3/2008 |
| KR | 10-2008-0101794 | | 11/2008 |
| KR | 10-2009-0055443 | | 6/2009 |
| KR | 10-2009-0069075 | | 6/2009 |
| KR | 1020090055443 | | 6/2009 |
| KR | 10-0920324 | | 10/2009 |
| KR | 100920324 | B1 | 10/2009 |
| KR | 10-0931331 | | 12/2009 |
| KR | 100931331 | B1 | 12/2009 |
| KR | 10-2010-0002886 | | 1/2010 |
| KR | 10-2010-0003536 | | 1/2010 |
| KR | 10-0936694 | | 1/2010 |
| KR | 10-0936695 | | 1/2010 |
| KR | 100936694 | B1 | 1/2010 |
| KR | 100936695 | B1 | 1/2010 |
| KR | 1020100002886 | | 1/2010 |
| KR | 1020100003536 | | 1/2010 |
| KR | 10-0946159 | | 3/2010 |
| KR | 10-0949913 | | 3/2010 |
| KR | 10-0949914 | | 3/2010 |
| KR | 100946159 | B1 | 3/2010 |
| KR | 100949913 | B1 | 3/2010 |
| KR | 100949914 | B1 | 3/2010 |
| KR | 10-2010-0064341 | | 6/2010 |
| KR | 10-0960958 | | 6/2010 |
| KR | 100960958 | B1 | 6/2010 |
| KR | 1020100064341 | | 6/2010 |
| KR | 10-1028408 | | 4/2011 |
| KR | 101028408 | B1 | 4/2011 |
| KR | 10-1072670 | | 10/2011 |
| KR | 101072670 | B1 | 10/2011 |
| KR | 10-1081694 | | 11/2011 |
| KR | 101081694 | B1 | 11/2011 |
| KR | 10-1095687 | | 12/2011 |
| KR | 101095687 | B1 | 12/2011 |
| KR | 10-1134277 | | 4/2012 |
| KR | 10-1136302 | | 4/2012 |
| KR | 101134277 | B1 | 4/2012 |
| KR | 101136302 | B1 | 4/2012 |
| WO | 2011009002 | A2 | 1/2011 |
| WO | WO2011/009002 | | 1/2011 |

OTHER PUBLICATIONS

International Search Report and Written Opinion dated Dec. 15, 2008 for PCT/US2008/080044.

CN Office Action dated Jan. 14, 2018 for Application No. 201710650874.5.

International Search Report, mailed Mar. 29, 2013, for PCT/US2012/061022, which corresponds to the parent U.S. Appl. No. 13/653,952.

PCT International Preliminary Report on Patentability in PCT/US2012/061022, dated May 1, 2014, 9 pages.

* cited by examiner

APPARATUS AND METHOD FOR PROVIDING UNIFORM FLOW OF GAS

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATIONS

This application claims priority under 35 U.S.C. § 119(e) to U.S. Provisional Application No. 61/548,942, filed Oct. 19, 2011.

BACKGROUND

Embodiments of the invention generally relate to an apparatus and a method for flowing a gas into a processing chamber. More specifically, embodiments of the invention are directed to linear flow apparatus for directing a flow of gas to a processing chamber such as an atomic layer deposition chamber or chemical vapor deposition chamber.

In the field of semiconductor processing, flat-panel display processing or other electronic device processing, vapor deposition processes have played an important role in depositing materials on substrates. As the geometries of electronic devices continue to shrink and the density of devices continues to increase, the size and aspect ratio of the features are becoming more aggressive, e.g., feature sizes of 0.07 μm and aspect ratios of 10 or greater. Accordingly, conformal deposition of materials to form these devices is becoming increasingly important.

During an atomic layer deposition (ALD) process, reactant gases are introduced into a process chamber containing a substrate. Generally, a region of a substrate is contacted with a first reactant which is adsorbed onto the substrate surface. The substrate is then contacted with a second reactant which reacts with the first reactant to form a deposited material. A purge gas may be introduced between the delivery of each reactant gas to ensure that the only reactions that occur are on the substrate surface.

Gas distribution apparatus, sometimes shaped like and referred to as showerheads, distribute processing gases to a substrate (also referred to as a wafer) at close proximity. Gas distribution apparatuses, including showerheads, have large volumes which can be very difficult to clean or purge between gases. Any gases remaining in the showerhead may react with subsequent processing gases. For ALD processes, separation of gases is important within a gas distribution apparatus, including showerheads, that relies on alternating pulses of gases, for example, an A pulse, a B pulse, an A pulse, and a B pulse type delivery. Therefore, there is an ongoing need in the art for improved gas distribution apparatuses, including showerheads, that are easy to clean/purge and provide a uniform supply of gases to the substrate.

SUMMARY

One or more embodiments of the invention are directed to gas distribution apparatuses for controlling flow of gas into a process chamber. The apparatus comprises a delivery channel having an inlet end, an outlet end, a length and a plurality of apertures spaced along the length. An inlet on the inlet end of the delivery channel is connectable to a gas source, wherein flow of the gas is controllable by a gas valve in communication with the inlet. An outlet on the outlet end of the delivery channel is connectable to a vacuum source, wherein vacuum pressure through the outlet is controllable by an outlet valve to provide a reduced pressure at the outlet. A controller to regulate the flow of the gas through the delivery channel and into the process chamber by opening and closing the outlet valve during gas delivery and gas purging in the channel to control the flow of gas through the apertures along the length of the channel.

In some embodiments, a flow of gas through the gas distribution apparatus has a more uniform conductance along an axial length of the gas distribution apparatus than the flow of gas through a similar gas distribution apparatus without the vacuum source connected to the outlet. In one or more embodiments, when the gas valve is closed, the gas is purged from the delivery channel faster than a similar gas distribution apparatus without the vacuum source.

In some embodiments, the delivery channel is a recessed channel in a back side of a gas distribution plate and the plurality of apertures extend through the gas distribution plate to a front side of the gas distribution plate.

In one or more embodiments, the gas distribution plate is round and the delivery channel forms a spiral shape with one of the inlet end and outlet end is positioned in an outer peripheral region of the gas distribution plate and the other of the inlet end and outlet end positioned in a central region of the gas distribution plate. In some embodiments, the inlet end is positioned at the outer peripheral region of the gas distribution plate and the outlet end is positioned at the central region of the gas distribution plate. In one or more embodiments, the outlet end is positioned at the outer peripheral region of the gas distribution plate and the inlet end is positioned at the central region of the gas distribution plate.

In some embodiments, there are two delivery channels recessed in the back side of the gas distribution plate. In some embodiments, each of the delivery channels forms a spiral shape with one of the inlet end and outlet end positioned in an outer peripheral region of the gas distribution plate and the other of the inlet end and outlet end positioned in a central region of the gas distribution plate. In one or more embodiments, the two delivery channels are intertwined along the spiral shape. In certain embodiments, each delivery channel has the inlet end positioned in the outer periphery region of the gas distribution plate and the outlet end positioned in the central region of the gas distribution plate. In some embodiments, each delivery channel has the outlet end positioned in the outer periphery region of the gas distribution plate and the inlet end positioned in the central region of the gas distribution plate. In one or more embodiments, the inlet end of one delivery channel is positioned in the outer periphery region of the gas distribution plate and the outlet end of the other delivery channel is positioned in the outer periphery region of the gas distribution plate.

In some embodiments, the gas distribution apparatus further comprises a back cover on the back side of the gas distribution plate, the back cover covering the recessed channel. In one or more embodiments the delivery channel is a tubular spiral having a substantially planar configuration. In some embodiments, the gas distribution apparatus comprises a plurality of delivery channels, each delivery channel extending substantially straight and substantially parallel to adjacent delivery channels.

In one or more embodiments, more than one of the delivery channels are connected to the inlet so that a gas flowing through the inlet flows through each of the delivery channels. In some embodiments, each of the delivery channels connected to the inlet merge and are connected to one outlet. In some embodiments, each of the delivery channels connected to the inlet has a separate outlet connected to a separate outlet valve. In one or more embodiments, the controller independently adjusts each of the outlet valves to maintain a substantially uniform flow of gas through each of the delivery channels. In an embodiment, the plurality of delivery channels are shaped to form one or more of words or logos.

In some embodiments, the plurality of delivery channels are shaped so that the hole pattern seen by a substrate is uniform across the gas distribution apparatus.

Additional embodiments of the invention are directed to processing chambers comprising the gas distribution apparatus described. In some embodiments, the gas distribution apparatus comprises a tubular spiral having a substantially planar configuration, the gas distribution apparatus positioned between a substrate support and a gas distribution plate.

Additional embodiments of the invention are directed to gas distribution apparatus, comprising a gas distribution plate, a back cover, an inlet, an outlet and a controller. A gas delivery channel is recessed in a back side of a gas distribution plate. The recessed gas delivery channel has an inlet end, an outlet end, a length and a plurality of apertures spaced along the length extending through the gas distribution plate to a front side of the gas distribution plate so that gas flowing through the gas delivery channel can pass through the apertures exiting the gas distribution plate. The back cover is on the back side of the gas distribution plate covering the recessed channel. The inlet is connected to the inlet end of the gas delivery channel through the back cover. The inlet is connectable to a gas source, wherein a flow of gas is controllable by a gas valve in communication with the inlet. An outlet is connected to the outlet end of the gas delivery channel through the back cover. The outlet is connectable to a vacuum source, wherein vacuum pressure through the outlet is controllable by an outlet valve to provide a reduced pressure at the outlet. The controller regulates the flow of gas through the gas delivery channel and into a process chamber by opening and closing the outlet valve during gas delivery and gas purging to control the flow of gas through the apertures along the length of the channel.

In some embodiments, the gas distribution plate is round and the delivery channel forms a spiral shape with one of the inlet end and outlet end is positioned in an outer peripheral region of the gas distribution plate and the other of the inlet end and outlet end positioned in a central region of the gas distribution plate. In one or more embodiments, there are two delivery channels recessed in the back side of the gas distribution plate, the two delivery channels intertwined along the spiral shape.

Further embodiments of the invention are directed to gas distribution apparatuses comprising a plurality of elongate delivery channels. Each delivery channel extends from an inlet end along a length to an outlet end and has a plurality of apertures spaced along the length. The inlet end is connectable to a gas source, wherein flow of gas is controllable by a gas valve in communication with the inlet end. The outlet end is connectable to a vacuum source, wherein vacuum pressure through the outlet end is controllable by an outlet valve to provide a reduced pressure at the outlet end. A plurality of elongate vacuum channels with each channel extending along a length. A controller regulates the flow of gas through the gas delivery channel and into a process chamber by opening and closing the outlet valve during gas delivery and gas purging to control the flow of gas through the apertures along the length of the channel. The plurality of apertures of each delivery channel are separated from the plurality of apertures of an adjacent delivery channel by at least one elongate vacuum channel.

BRIEF DESCRIPTION OF THE DRAWINGS

So that the manner in which the above recited features of the invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
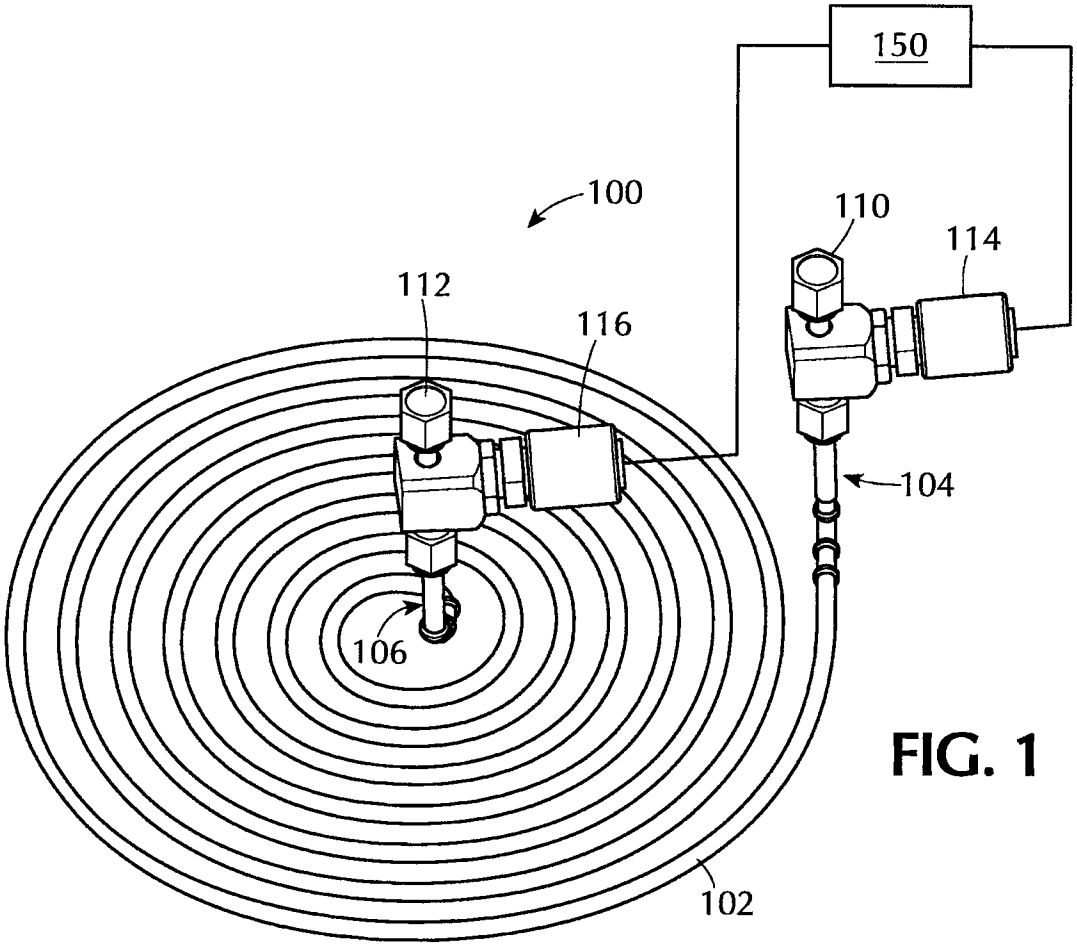
FIG. 1 shows a view of a gas distribution apparatus in accordance with one or more embodiments of the invention.

Embodiments of the invention are directed to gas distribution apparatus for use in chemical vapor deposition type processes. One or more embodiments of the invention are directed to atomic layer deposition processes and apparatus (also called cyclical deposition) incorporating the gas distribution apparatus described. The gas distribution apparatus described may be referred to as a showerhead or gas distribution plate, but it will be recognized by those skilled in the art that the apparatus does not need to be shaped like a showerhead or plate. The terms "showerhead" and "plate" should not be taken as limiting the scope of the invention.

A first embodiment of the invention is directed to an apparatus with a single spiral gas delivery channel. All gases flow sequentially through the same channel. An inlet is on the outer radial edge of the spiral, also referred to as the outer periphery, and may be attached to a gas source. A vacuum attachment is connected to the internal end of the spiral. The inlet and outlet can be reversed, either the gas source can be connected to the inside of the spiral with the outlet valve at the outside end of the spiral. The first embodiment can be used with a sequence as shown in Table 1.

TABLE 1

| Step | Gas Source | Outlet Valve |
|---|---|---|
| 1 | Precursor A | Closed |
| 2a | Purge | Closed |
| 2b | Purge | Open |
| 2c | Purge | Closed |
| 3 | Precursor B | Closed |

A second embodiment has two spiral channels intertwined. Each channel has a gas inlet on the outer radial end of the spiral and an outlet valve on the inner radial end of each spiral. The inlet and outlet can be reversed or mixed. The different channels can be used for different precursors.

In a third set of embodiments, the channel is a linear gas line. The linear gas line can take any suitable shape, not just linear. There can be multiple linear gas lines for different precursors. Some embodiments have multiple parallel paths for all gases in sequence, where conductance of the gas channels are substantially the same.

In one or more embodiments, in an individual channel, conductance of the gas through the channel and through the apertures is controlled by modulating or changing the vacuum pressure at the outlet end. Changing the vacuum pressure in turn creates a unique flow dynamic that cannot be achieved in conventional gas distribution apparatus. In some embodiments, a more uniform gas flow is provided along the length of each channel and through the apertures spaced along the length of the channel. A uniform gas flow according to one or more embodiments means that there is substantially no dead space that inhibits flow or pumping of gasses through the channel. The provision of a vacuum with or without a valve on one end of the channel with a valve at the other end of the channel permits rapid switching between different types of gases, such as precursor or reactant gases.

In some embodiments, the vacuum at the end of the gas delivery channel enables the rapid purging of gases from within the channel. A purge gas source can be connected to the inlet of the gas delivery channel and work cooperatively with the vacuum at the outlet of the channel to even more rapidly remove the reactive gases from the channel. Additionally, vacuum ports can be spaced along the length of the gas delivery channel, not just at the end of the channel.

Embodiments of the invention may be capable of increasing the conductance of gas through the holes spaced along the gas delivery channel. Without being bound by any particular theory of operation, it is believed that controlling the vacuum pressure at the outlet end, or in the middle, of the channel changes the flow dynamics relative to a conventional showerhead or gas distribution plate.

Figure 2:
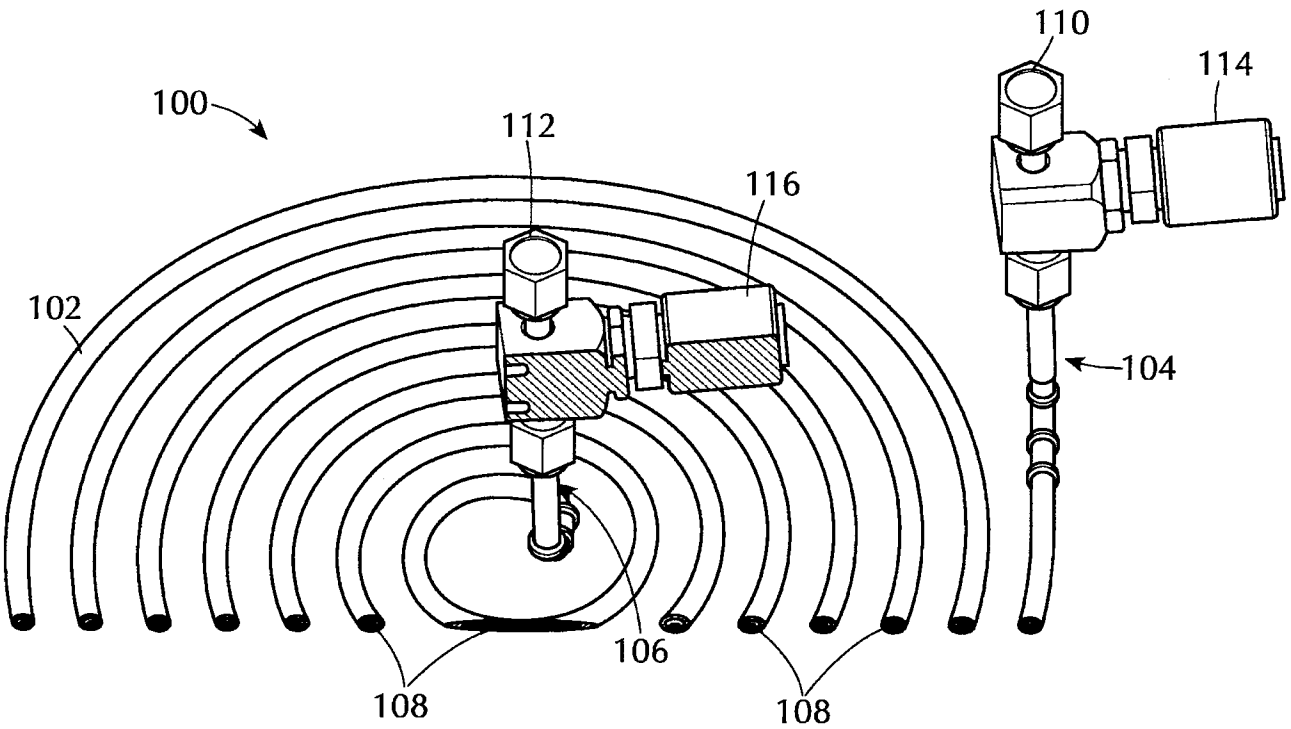
FIG. 2 shows a view of a gas distribution apparatus in accordance with one or more embodiments of the invention.

Referring to FIGS. 1 and 2, one or more embodiments are directed to gas distribution apparatus 100 to deliver a gas to a process chamber (not shown). The gas distribution apparatus 100 comprises a delivery channel 102 with an inlet end 104 and an outlet end 106. The delivery channel 102 has a plurality of apertures 108 spaced along the length of the delivery channel 102. An inlet 110 is connected to and in fluid communication with the inlet end 104 of the delivery channel 102. An outlet 112 is connected to and in fluid communication with the outlet end 106 of the delivery channel 102. The inlet 110 is adapted to be connected to a gas source and may include an inlet valve 114 capable of controlling the flow of gas into (or out of) the delivery channel 102 or completely cut off the flow of gas. The outlet 112 is adapted to be connected to a vacuum source and may include an outlet valve 116 capable of controlling the flow of gas into (or out of) the delivery channel 102 or completely cut off the flow of gas. The outlet 112 is connectable to a vacuum source (not shown) so that vacuum pressure through the outlet 112 is controllable by the outlet valve 116 to provide a reduced pressure at the outlet 112.

A controller 150 regulates the flow of the gas through the delivery channel 102 and into the process chamber. The controller 150 does this by opening or closing (or any point in between fully open and fully closed) the outlet valve during gas delivery and gas purging. This controls the flow of gas through apertures (seen, for example, in FIG. 4) spaced along the length of the channel.

The cross-sectional shape of the delivery channel 102 can be controlled such that gas flowing through the delivery channel experiences minimal resistance to flow. In some embodiments, the delivery channel 102 has a round or oval cross-sectional shape. In one or more embodiments, the delivery channel 102 has a cross-sectional shape sufficient such that bends, turns, twists, etc. provide substantially no dead space.

The overall shape (as opposed to the cross-sectional shape) of the delivery channel 102 can be modified as desired. For example, the delivery channel 102 can be shaped to fit within specific areas or to match the shape of a substrate. The delivery channel 102 can be, for example, straight, round, square, oval, rectangular or oblong. Additionally, the overall shape of the delivery channel can be made up of repeating units, parallel, perpendicular or concentric to each other. In one or more embodiments, the delivery channel has an overall shape in which there is substantially no dead space to inhibit gas flow or purging. As used in this specification and the appended claims, the term "substantially no dead space" means that the flow of gas, or purging, is inhibited by less than about 10% or by less than about 5% due to dead space.

In some embodiments, the delivery channel 102 is a tubular spiral having a substantially planar configuration. This particular shape is exemplified by the embodiment shown in FIGS. 1 and 2. As used in this specification and the appended claims, the term "substantially planar configuration" means that the plurality of apertures 108 in the delivery channel 102 are in mostly the same plane. The embodiment shown in FIGS. 1 and 2 has a substantially planar configuration because the apertures are coplanar, even though the inlet end and outlet end, and the portions of the delivery channel near the inlet end and outlet end are not coplanar with the plurality of apertures.

The delivery channel 102 can be used for plasma processing. For example, the delivery channel 102 can be polarized relative to another portion of the processing chamber to ignite a plasma within the chamber. The delivery channel 102 can be biased relative to a portion of the chamber, or a portion of the chamber can be biased relative to the delivery channel 102. For example, the delivery channel 102 can be polarized relative to the pedestal, or the pedestal can be polarized relative to the delivery channel. The frequency of the plasma can be tuned as well. In one or more embodiments, the plasma is at a frequency of about 13.56 MHz. In some embodiments, the plasma is at a frequency of about 40 MHz, 50 MHz, 60 MHz, 70 MHz, 80 MHz, 90 MHz, 100 MHz, 110 MHz or 120 MHz.

Any suitable material can be used for the delivery channel, showerhead or gas distribution apparatus. Suitable materials include, but are not limited to stainless steel and inert materials. In some embodiments, the delivery channel, showerhead or gas distribution plate is made of stainless steel.

Figure 3:
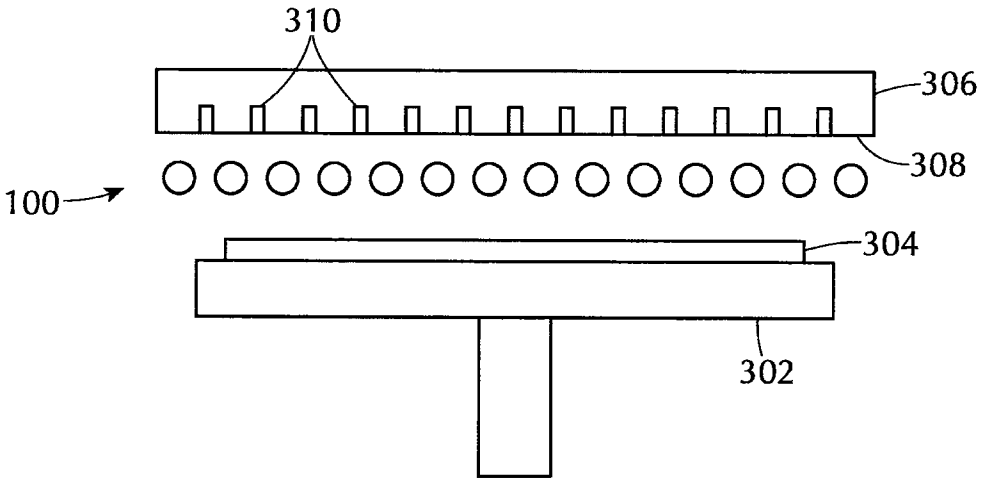
FIG. 3 shows a view of a processing chamber including one or more gas distribution apparatus in accordance with one or more embodiments of the invention.

FIG. 3 shows a cross-section of a portion of a processing chamber according to one or more embodiments. A gas distribution apparatus 100 is placed between a substrate support pedestal 302 and a gas distribution plate 306. The substrate support pedestal 302 is shown supporting a substrate 304. The substrate support pedestal 302 can be stationary or rotating, or can be stationary for part of the processing and rotating for part of the processing. A rotating support pedestal 302 may allow for more uniform processing of a substrate by minimizing different gas flow patterns that may occur throughout the processing chamber. The support pedestal 302 of some embodiments includes a heater or heating mechanism. The heater can be any suitable type of heater including resistive heaters.

The gas distribution apparatus 100 is shown as a tubular spiral with a substantially planar configuration. The substrate 304 can be processed with either, or both, the gas distribution plate 306 and the gas distribution apparatus 100. The gas distribution apparatus 100 can be shaped so that it does not substantially interfere with gas flowing from the gas distribution plate 306. As used in this specification and the appended claims, the term "substantially interfere" means that the gas distribution apparatus 100 does not interfere with more than about 30% of the gas flowing from the gas distribution plate. For example, the front surface 308 of the gas distribution plate 306 has a plurality of apertures 310 through which gases flow. The gas distribution apparatus 100 can be shaped to avoid blocking the apertures 310.

The delivery channel positioned like that of FIG. 3 can also be used for plasma processing. The apparatus 100 can be polarized relative to a portion of the chamber, or a portion of the chamber can be polarized relative to the apparatus 100. For example, the delivery channel apparatus 100 can be polarized relative to the pedestal 302, or the pedestal 302 can be polarized relative to the apparatus 100. In some embodiments, the apparatus 100 is polarized relative to the gas distribution plate 306. In one or more embodiments, the gas distribution plate 306 is polarized relative to the pedestal 302 and gas flowing from the apparatus 100 forms the plasma. The frequency of the plasma can be tuned as well. In one or more embodiments, the plasma is at a frequency of about 13.56 MHz. In some embodiments, the plasma is at a frequency of about 40 MHz, 50 MHz, 60 MHz, 70 MHz, 80 MHz, 90 MHz, 100 MHz, 110 MHz or 120 MHz.

FIGS. 4 through 7 show another embodiment of a gas distribution apparatus 400 in which the delivery channel 402 is a recessed channel in the back side 401 of a gas distribution plate 403. The embodiment shown has a large inner section is recessed in the back side 401 of the gas distribution plate 403 with the delivery channel 402 recessed even further. This allows for the addition of a back cover 407 which can be placed in the recessed area in the back side 401 enclosing the delivery channel 402. The back cover 407, when inserted into the recessed back side 401 of certain embodiments creates a substantially flush back side surface of the gas distribution plate. It will be understood by those skilled in the art that the back cover 407 does not need to fit within a recessed area of the back side 401 of the gas distribution plate 403, but can also rest directly on the back side 401 of the gas distribution plate 403. In embodiments of this sort, there is no large recessed area with the delivery channels being further recessed. Instead, the delivery channels are recessed directly into the back side 401 of the gas distribution plate 403.

The back cover 407 may have openings to allow for the passage of inlet and outlet tubes to allow for fluid communication with the delivery channel 402. This can be seen in FIGS. 5 and 6. The inlet and outlet tubes can be an integral part of the back cover 407, or can be separate pieces connected to the back cover 407 in such a manner as to prevent or minimize fluid leakage. A plurality of apertures 408 extend through the gas distribution plate 403 to a front side 405 of the gas distribution plate 403. These apertures can be seen in FIGS. 4, 5 and 7. The plurality of apertures 408 can be evenly spaced along the length of the delivery channel, or can have varied spacing along the length of the channel. Variable spacing may help produce a more uniform gas flow from the delivery channel at points along the delivery channel. For example, in gas delivery channel that has an elaborate shape, the spacing of the apertures can varied along the length.

In the embodiment shown in FIGS. 4-7, the gas distribution plate 403 is round and the delivery channel 402 forms a spiral shape. The inlet end 404 is denoted at the outside of the spiral in an outer peripheral region 420 of the gas distribution plate 403 with the outlet end 406 at the center of the spiral in a central region 422 of the gas distribution plate 403. It will be understood by those skilled in the art that the inlet end 404 and outlet end 406 can be reversed with the inlet end 404 being located at the center of the spiral and the outlet end 406 at the outside of the spiral. In some embodiments, one of the inlet end 404 and outlet end 406 is positioned in an outer peripheral region 420 of the gas distribution plate 403 and the other of the inlet end 404 and outlet end 406 is positioned in a central region 422 of the gas distribution plate 403. In one or more embodiments, the inlet end 404 is positioned at the outer peripheral region 420 of the gas distribution plate 403 and the outlet end 406 is positioned at the central region 422 of the gas distribution plate 403. In certain embodiments, the outlet end 406 is positioned at the outer peripheral region 420 of the gas distribution plate 403 and the inlet end 404 is positioned at the central region 422 of the gas distribution plate 403.

Figure 5:
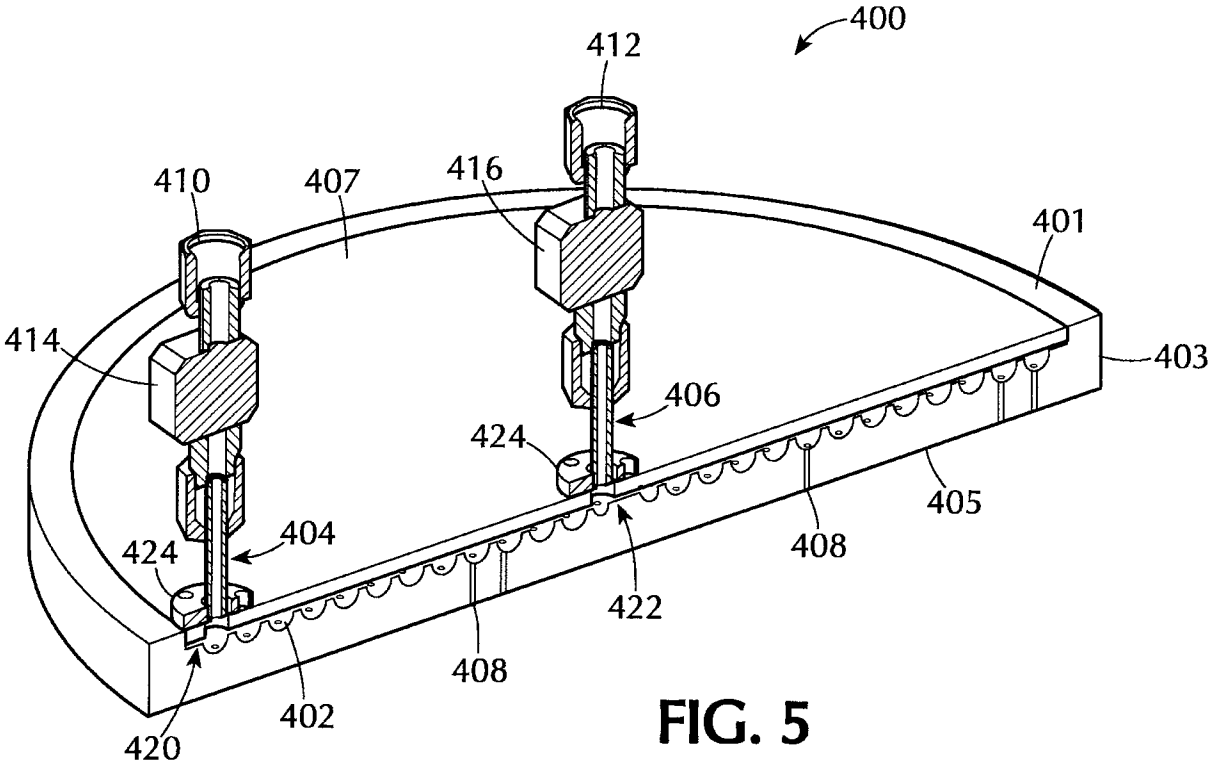
FIG. 5 shows a cross-section of a perspective view of a gas distribution apparatus in accordance with one or more embodiments of the invention
Figure 6:
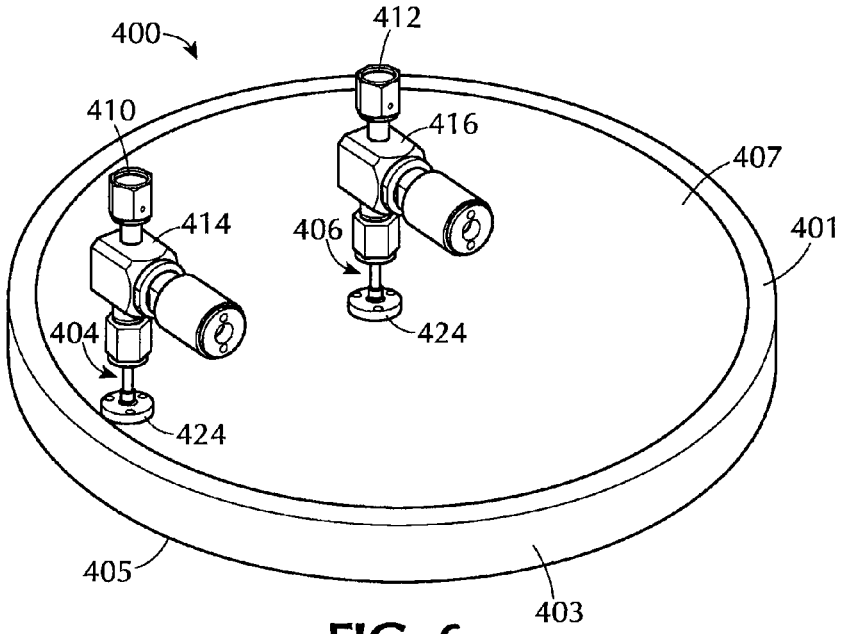
FIG. 6 shows a perspective view of a gas distribution apparatus in accordance with one or more embodiments of the invention.
Figure 7:
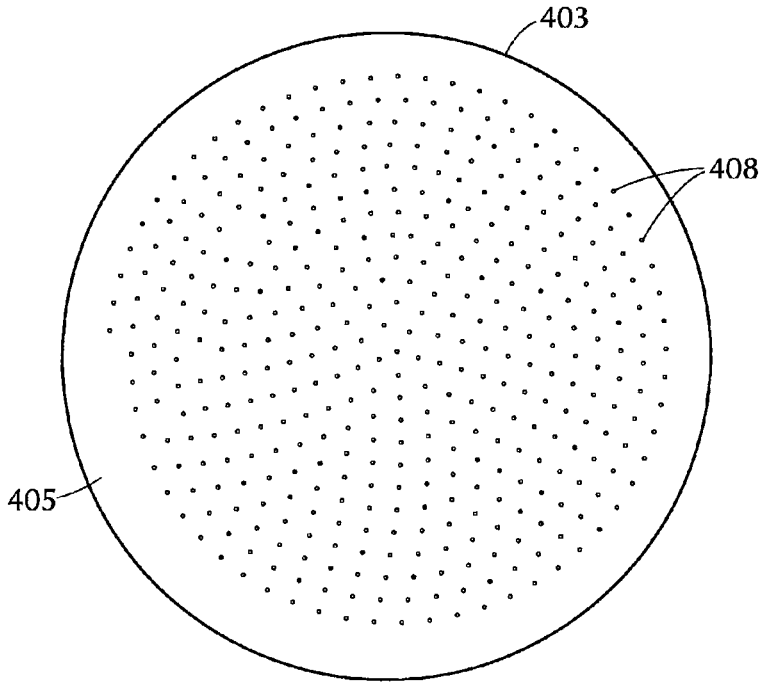
FIG. 7 shows a bottom view of a gas distribution apparatus in accordance with one or more embodiments of the invention.

In FIGS. 5 and 6, the inlet end 404 and outlet end 406 are illustrated as a small tube extending from the back cover 407 of the gas distribution plate 403. The tubes extend between the inlet 410 and the back cover 407 through an inlet valve 414. Another tube can extend between the outlet 412 and the back cover 407 through the outlet valve 416. The tubes can be connected to the back cover 407 by any suitable connection known to those skilled in the art and may be sealed to prevent leakage of fluid flowing through the tube into the delivery channel 402. Suitable sealing devices include, but are not limited to, o-rings positioned between a flange 424 and the back cover 407. The flange 424 can be integrally formed with the tube or can be a separate piece that holds the tube to the back cover. The flange 424 can be connected to the back cover 407 by any suitable mechanical connection, including but not limited to, screws.

Figure 8:
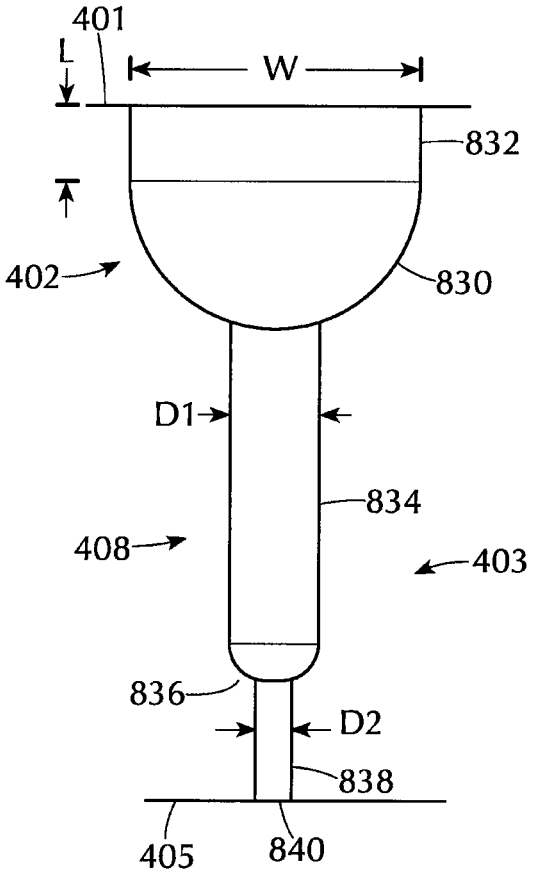
FIG. 8 shows a partial cross-sectional view of a gas distribution apparatus in accordance with one or more embodiments.

FIG. 8 shows a cross-sectional view of one portion of a delivery channel 402 and an aperture 408 in a gas distribution plate 403 in accordance with one or more embodiments of the invention. It will be understood by those skilled in the art that the delivery channel and apertures described in FIG. 8 are merely illustrative and should not be taken as limiting the scope of the invention. Those skilled in the art will understand that there are other ways of creating flow from the delivery channel 402 through the gas distribution plate 403. The delivery channel 402 shown in FIG. 8 has two portions, an upper portion 832 and a lower portion 830. While these portions are shown as separate areas, it will be understood that there can be a seamless transition between the upper portion 832 and the rounded lower portion 830.

Additionally, it will be understood that the upper portion 832 is optional and does not need to be included in the delivery channel 402. When there is no upper portion 832, the lower portion 830 is the only portion. Thus, the delivery channel can have any suitable shape. In some embodiments, the shape of the delivery channel is such that there is substantially no interference with the flow of gases through the channel.

The upper portion 832 can have my suitable shape. In the embodiment shown in FIG. 8, the upper portion 832 has walls which extend normal to the surface of the back side 401 of the gas distribution plate 403. However, it will be understood that the upper portion 832 can have walls which are canted from square to the back side 401. The canting can provide a larger opening at the back side 401 of the gas distribution plate 403, tapering to a smaller opening. Additionally, the canting can provide a smaller opening at the back side 401, tapering to a larger opening. The length of the upper portion 832 can be modified as necessary.

In some embodiments, the upper portion has sides which are substantially perpendicular to the back side 401 of the gas distribution plate 403 and extend a length L below the surface of the back side 401 in the range of about 0.01 inch to about 0.3 inches. As used in this specification and the appended claims, the term "substantially perpendicular to" means that walls of the upper portion have an angle relative to the back side of the gas distribution plate in the range of about 85 degrees to about 95 degrees. In some embodiments, the upper portion extends below the surface of the back side to a length L in the range of about 0.02 inches to about 0.2 inches, or in the range of about 0.05 inches to about 0.15 inches, or in the range of about 0.08 inches to about 0.12 inches. In one or more embodiments, the upper portion extends below the surface of the back side to a length about 0.1 inches.

The rounded lower portion 830 can have any suitable cross-section including, but not limited to, half-round and half-elliptical. The width of the rounded lower portion, also referred to as the diameter of the rounded lower portion, can be modified as necessary. The width of the upper portion can be modified as necessary. The diameter of the delivery channel, in general, can have an impact of the number of loops in the spiral. In some embodiments, as shown in FIG. 8, the width of the upper portion is about equal to the diameter of the lower portion. The delivery channel of various embodiments has a diameter in the range of about 0.3 inches to about 0.45 inches, or in the range of about 0.325 inches to about 0.425 inches, or in the range of about 0.35 inches to about 0.40 inches. In one or more embodiments, the delivery channel has a diameter of about 0.375 inches.

The specific shape of the apertures 408 can vary depending on the desired flow of gases through the apertures. In the embodiment of FIG. 8, the aperture 408 has three distinct sections; a first section 834, a second section 836 and a third section 838. Again, the number of sections and the shape of the sections are merely illustrative of one embodiment and should not be taken as limiting the scope of the invention. The first section 834 extends from the rounded lower portion 830 of the delivery channel 402 toward the front side 405 of the gas distribution plate 403. The first section 834 has a first diameter D1. The second section 836 extends from the first section 834 toward the front side 405 and has a diameter which tapers from the first diameter D1 to a second diameter D2, which is generally smaller than the first diameter. The third section 838 extends from the end of the second section 836 and ends at the front side 405 of the gas distribution plate 403. At the intersection of the third section 838 and the front side 405, a hole 840 is formed. Gases flowing through the delivery channel 402 exit the gas distribution plate 403 through this hole 840 into the processing chamber. The hole 840 has about the same diameter as the second diameter D2. In various embodiments, the diameter of the hole 840 is in the range of about 0.01 inches to about 0.25 inches, or in the range of about 0.02 inches to about 0.2 inches, or in the range of about 0.03 inches to about 0.15 inches or in the range of about 0.04 inches to about 0.1 inches. In some embodiments, the hold 840 has a diameter less than about 0.1 inches, or less than about 0.08 inches, or less than about 0.06 inches, or less than about 0.04 inches, or less than about 0.02 inches, or less than about 0.01 inch.

As the delivery channel spirals from the outer peripheral edge of the gas distribution plate to the central region, or vice versa, a seeming plurality of adjacent channels are observable in cross-section, even though it may be a single channel. FIG. 5 shows this seeming plurality of channels. The channels, or separation between loops of the spiral, are separated by a distance. In some embodiments, the distance between the channels, or the loops of the single channel, measured from centers, are in the range of about 0.375 inches to about 0.475 inches, or in the range of about 0.40 inches to about 0.45 inches, or in the range of about 0.41 inches to about 0.43 inches. In one or more embodiments, the average distance between centers of the adjacent channels is about 0.42 inches.

The length of the gas channel shown in FIGS. 4 to 7 can vary depending on a number of factors, including, but not limited to, the diameter of the channel and the distance between the adjacent channels. In various embodiments, the delivery channel has a length in the range of about 140 inches to about 340 inches, or in the range of about 180 inches to about 300 inches, or in the range of about 200 inches to about 280 inches, or in the range of about 220 inches to about 260 inches. In one or more embodiments, the delivery channel has a length of about 240 inches.

The number of apertures are also dependent on a number of factors, including but not limited to, the length of the delivery channel and the spacing of the apertures. In some embodiments having a single spiral channel, there are in the range of about 300 and 900 apertures, or in the range of about 400 to about 800 apertures, or in the range of about 500 to about 700 apertures. In various embodiments, there are greater than about 300, 400, 500, 600, 700 or 800 apertures along the length of the channel. In one or more embodiments, there are about 600 apertures along the length of the delivery channel.

Figure 4:
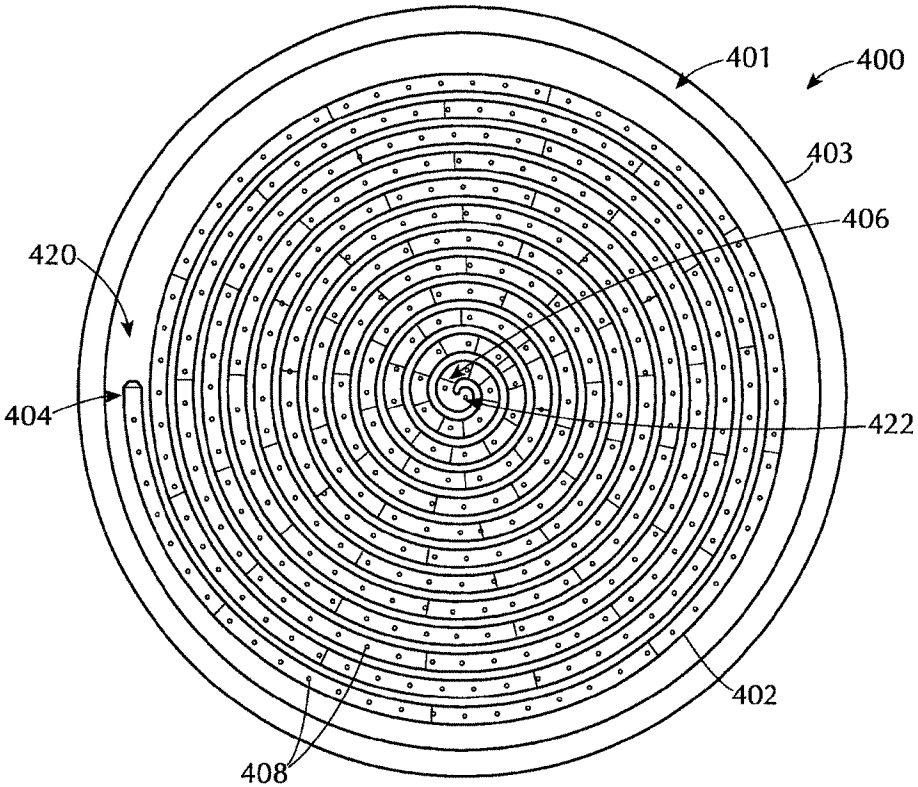
FIG. 4 shows a top view of a gas distribution apparatus in accordance with one or more embodiments of the invention.

In an embodiment, as shown in FIG. 4, the gas delivery plate 403 comprises a single delivery channel 402 in a back side of the gas delivery plate 403. The delivery channel 402 has an inlet end 404 located in an outer peripheral region 420 of the gas distribution plate 403. The delivery channel 402 and follows an inward spiral path from the inlet end 404 to an outlet end 406 located in a central region 422 of the gas distribution plate 403. The delivery channel 402 has an overall length, defined as the distance between the inlet end 404 and the outlet end 406 of about 240 inches. A plurality of apertures 408 are spaced along the overall length of the delivery channel 402. Along the overall length of the delivery channel 403 there are in the range of about 500 apertures and about 700 apertures. The delivery channel 403 has an average diameter of about 0.375 inches and adjacent portions of the spiral channel are spaced about 0.42 inches on center.

Some embodiments of the invention include more than one delivery channel 402. These multiple channels can be intertwined or separate depending on the needs of the processing system. Some channels can be recessed into a gas distribution plate as shown in FIG. 4, or can be individual tubes as shown in FIG. 1. In some embodiments, there are a combination of individual tubes and recessed channels. An exemplary embodiment of the sort is shown in FIG. 3, where the gas distribution plate may have at least one recessed delivery channel therein and an additional delivery channel is positioned between the gas distribution plate and the substrate surface.

Figure 15:
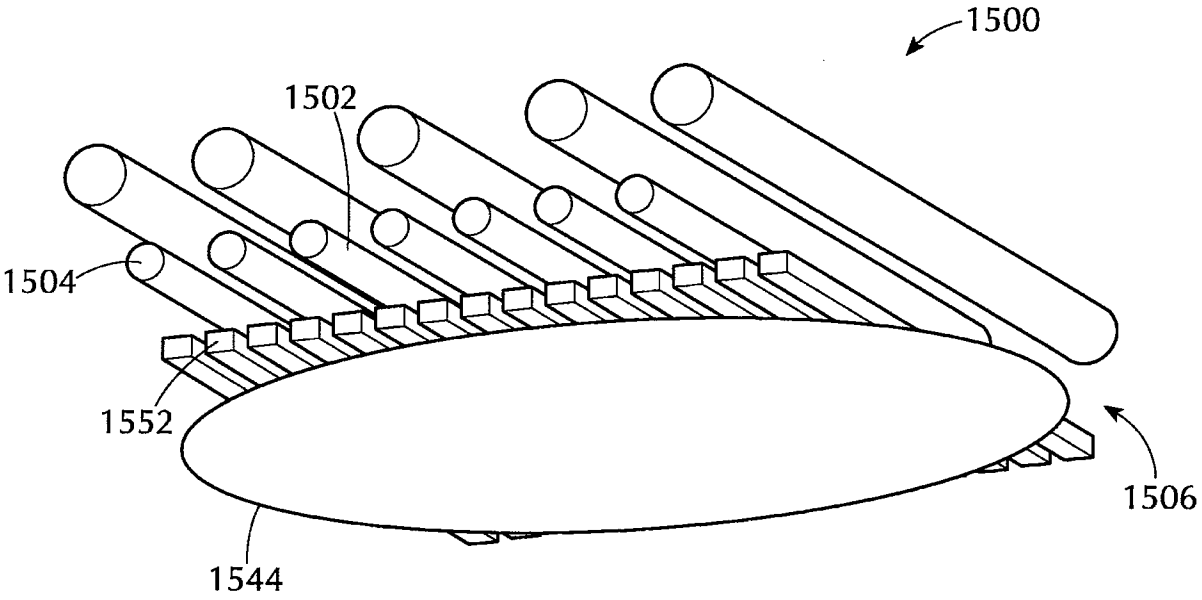
FIG. 15 shows a perspective view of a gas distribution apparatus in accordance with one or more embodiments of the invention.

Another embodiment of the invention is shown in FIGS. 9 through 14. A gas distribution apparatus 900 comprises two delivery channels 902a, 902b recessed in the back side 901 of a gas distribution plate 903. It will be understood that the delivery channels do not need to be recessed into the back of a gas distribution plate, but can be individual tubes, as shown in FIGS. 1 and 15. The first delivery channel 902a has a first inlet end 904a and a first outlet end 906a and a plurality of first apertures 908a spaced along the length of the first delivery channel 902a. The second delivery channel 902b has a second inlet end 904b, a second outlet end 906b and a plurality of second apertures 908b spaced along the length of the second delivery channel 902b.

A first inlet 910a is connected to the first inlet end 904a of the first delivery channel 902a. The first inlet 910a is adapted to be connected to a gas source. A first outlet 912a is connected to the first outlet end 906a of the first delivery channel 902a. The first outlet 912a is adapted to be connected to a vacuum source. A second inlet 910b is connected to the second inlet end 904b of the second delivery channel 902b. The second inlet 910b is adapted to be connected to a gas source. A second outlet 912b is connected to the second outlet end 906b of the second delivery channel 902b. The second outlet 912a is adapted to be connected to a vacuum source.

In the embodiment shown in FIGS. 9 to 14, each of the delivery channels 902a, 902b form a spiral shape. One or more embodiments, as that shown in the Figures, have the two delivery channels 902a, 902b intertwined along the length of the spiral shape. It will be understood by those skilled in the art that the two delivery channels 902a, 902b can have shapes other than spiral and do not need to intertwine. In certain embodiments, the plurality of first apertures 908a and second apertures 908b extend through the gas distribution plate 903 to the front side 905 of the gas distribution plate 903.

In some embodiments, each of the delivery channels 902a, 902b form a spiral shape with one of the inlet end 904a, 904b and outlet end 906a, 906b positioned in an outer peripheral region 920 of the gas distribution plate 903 and the other of the inlet end 904a, 904b and outlet end 906a, 906b positioned in a central region 922 of the gas distribution plate 903. In one or more embodiments, the inlet ends 904a, 904b of both channels 902a, 902b is positioned in the outer peripheral region 920 and the inlet ends 904a, 904b of both channels 902a, 902b are positioned in the central region 922 of the gas distribution plate 903. In certain embodiments, the inlet ends 904a, 904b of both channels 902a, 902b is positioned in the central region 922 and the inlet ends 904a, 904b of both channels 902a, 902b are positioned in the outer peripheral region 920 of the gas distribution plate 903. In one or more embodiments, one or the inlet ends 904a, 904b is positioned in the outer peripheral region 920 and the other inlet end 904b, 904a is positioned at the central region 922, with the outlet ends 906a, 906b at the other end of each individual delivery channel 902a, 902b.

Figure 9:
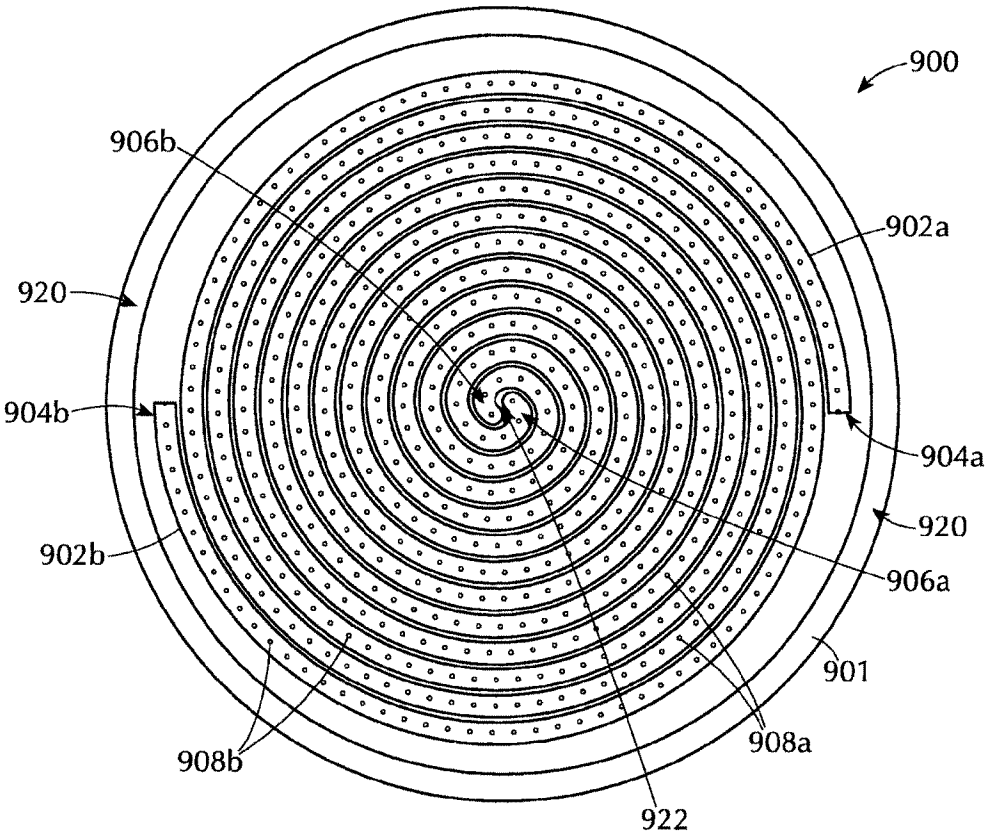
FIG. 9 shows a top view of a gas distribution apparatus in accordance with one or more embodiments of the invention.
Figure 10:
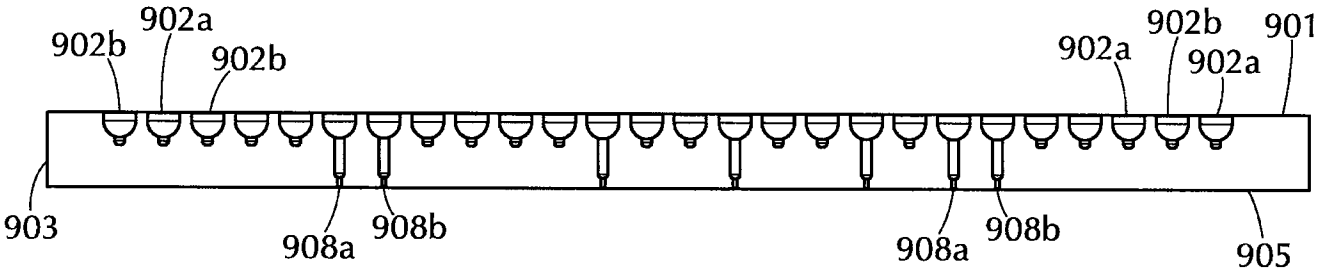
FIG. 10 shows a partial cross-sectional view of a gas distribution apparatus in accordance with one or more embodiments of the invention.
Figure 11:
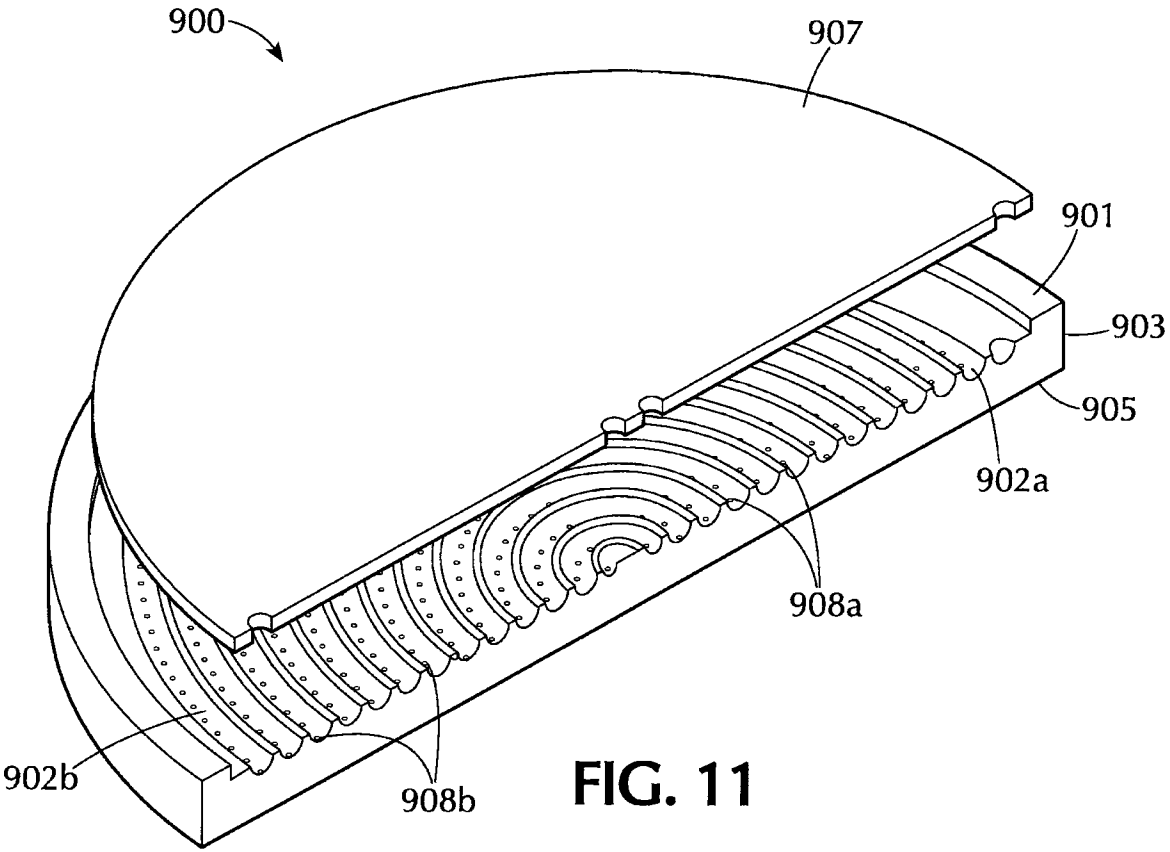
FIG. 11 shows a view of an exploded partial cross-sectional view of a gas distribution apparatus in accordance with one or more embodiments of the invention
Figure 12:
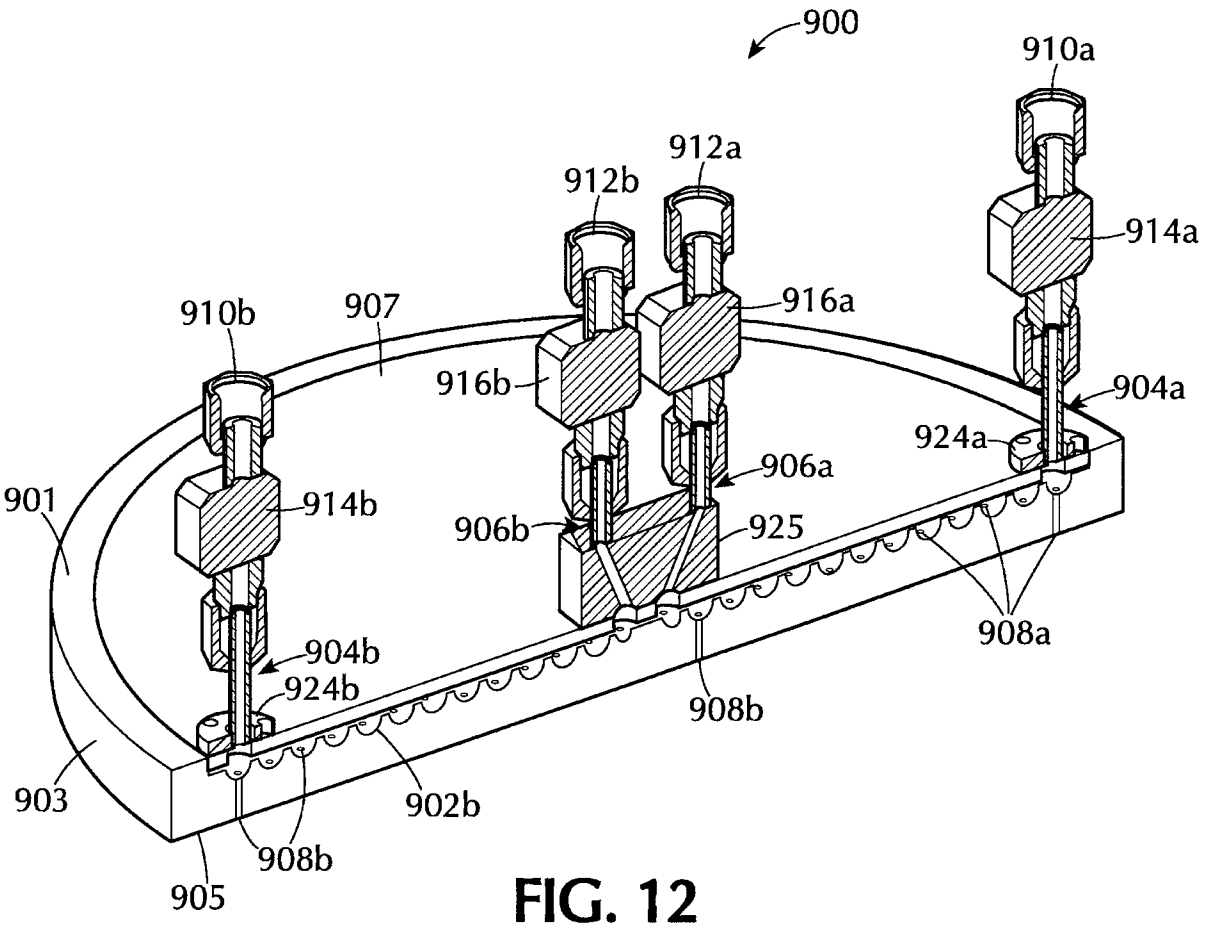
FIG. 12 shows a cross-section of a perspective view of a gas distribution apparatus in accordance with one or more embodiments of the invention
Figure 13:
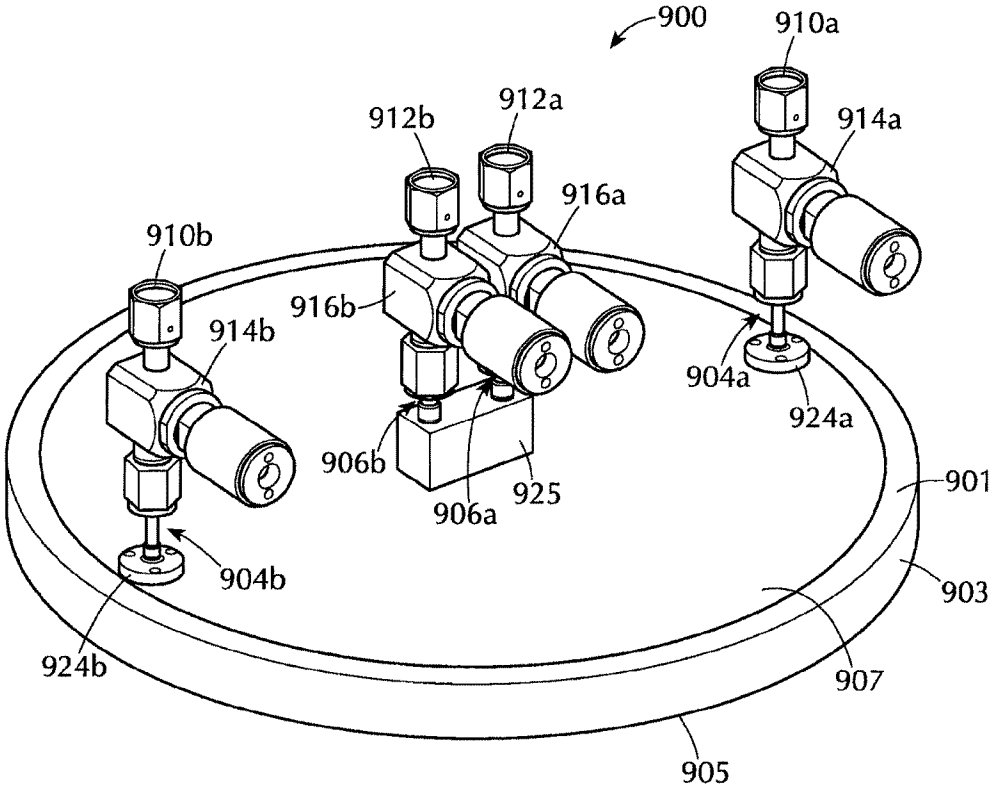
FIG. 13 shows a perspective view of a gas distribution apparatus in accordance with one or more embodiments of the invention.
Figure 14:
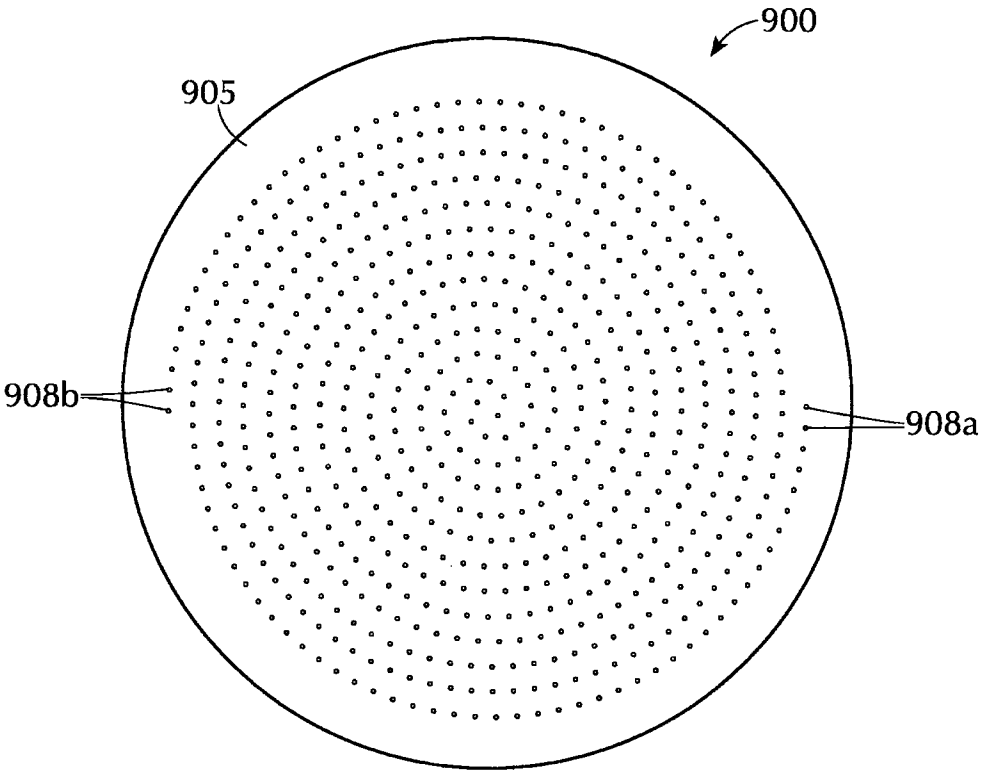
FIG. 14 shows a bottom view of a gas distribution apparatus in accordance with one or more embodiments of the invention.

FIG. 11 shows a back cover 907 for the gas distribution plate 903 shown in FIG. 9. There are four holes (not numbered) located in the back cover 907 which align approximately with the inlet ends 904a, 904b and outlet ends 906a, 906b of the delivery channels 902a, 902b. The holes can be used to provide an access point for connected in the inlet 910a, 910b and outlet 912a, 912b to the channels 902a, 902b. In some embodiments, there inlet 910a, 910b and outlet 912a, 912b are integrally formed with the back cover 907. Additionally, as seen in FIGS. 12 and 13, there can be one or more inlet valves 914a, 914b and outlet valves 916a, 916b FIGS. 12 and 13 show perspective views of a gas distribution apparatus 900 in accordance with various embodiments of the invention. The inlets 910a, 910b are shown connected to the back cover 907 with a flange 924a, 924b. The connection and gas-tight sealing of the flange 924a, 924b can be accomplished by any suitable mechanism and techniques as known to those skilled in the art. The outlets 912a, 912b can also be connected to the back cover 907 with a flange or with a block connection 925. The block 925 can be integrally formed with the back cover 907 or can be a separate piece. The block 925 may provide additional support and space for the outlet valves 916a, 916b, allowing the connecting tubes to protrude from the back cover 907 at an angle. Although the inlets 910a, 910b and inlet valves 914a, 914b are shown on the outside peripheral region 920 of the gas distribution plate 903 and the outlets 912a, 912b and outlet valves 916a, 916b are shown at the central region 922 of the gas distribution plate 903, it will be understood that these components can be reversed or intermixed and that the drawings are merely illustrative of one embodiment.

As the delivery channels spiral from the outer peripheral edge of the gas distribution plate to the central region, or vice versa, a seeming plurality of adjacent channels are observable in cross-section. With the spirals intertwined, the gas in every adjacent channel is from the other inlet 910a, 910b. The channels are separated by a distance from the adjacent channels. In some embodiments, the distance between the channels, measured from the center of the channel, are in the range of about 0.375 inches to about 0.475 inches, or in the range of about 0.40 inches to about 0.45 inches, or in the range of about 0.41 inches to about 0.43 inches. In one or more embodiments, the average distance between centers of the adjacent channels is about 0.42 inches.

The length of the gas channel shown in FIGS. 9-14 can vary depending on a number of factors, including, but not limited to, the diameter of the channel and the distance between the adjacent channels. In various embodiments, each of the delivery channels has a length in the range of about 70 inches to about 170 inches, or in the range of about 90 inches to about 150 inches, or in the range of about 100 inches to about 140 inches, or in the range of about 110 inches to about 130 inches. In one or more embodiments, the delivery channel has a length of about 120 inches.

The number of apertures are also dependent on a number of factors, including but not limited to, the length of the delivery channel and the spacing of the apertures. In some embodiments having a single spiral channel, there are in the range of about 150 and 450 apertures, or in the range of about 200 to about 400 apertures, or in the range of about 250 to about 350 apertures. In various embodiments, there are greater than about 150, 200, 250, 300, 350 or 400 apertures along the length of the channel. In one or more embodiments, there are about 300 apertures along the length of each of the delivery channels.

The apparatus shown in FIGS. 4 through 14 can be used for plasma processing. For example, the delivery channel, gas distribution apparatus or showerhead can be polarized relative to another portion of the processing chamber to ignite a plasma within the chamber. The delivery channel, gas distribution apparatus or showerhead can be polarized relative to a portion of the chamber, or a portion of the chamber can be biased relative to the delivery channel, gas distribution apparatus or showerhead. For example, the delivery channel, gas distribution apparatus or showerhead can be polarized relative to the pedestal, or the pedestal can be polarized relative to the delivery channel, gas distribution apparatus or showerhead. The frequency of the plasma can be tuned as well. In one or more embodiments, the plasma is at a frequency of about 13.56 MHz. In some embodiments, the plasma is at a frequency of about 40 MHz, 50 MHz, 60 MHz, 70 MHz, 80 MHz, 90 MHz, 100 MHz, 110 MHz or 120 MHz.

In some embodiments of the apparatus exemplified by FIGS. 4 through 14, there is an insulating material (not shown) positioned between the back cover and the main body portion of the gas distribution apparatus (i.e., the portion including the gas delivery channel). This insulating material provides electrical isolation between the back cover and the main body portion of the gas distribution apparatus so that the back cover can be polarized relative to the main body portion. Doing so may allow for the ignition of a plasma within the gas distribution apparatus, or within the delivery channels. The plasma can then be flowed through the plurality of apertures into the processing region of the processing chamber, the processing region being the region between the gas distribution apparatus and the pedestal. This configuration may be referred to as a remote plasma because the plasma is formed (e.g., ignited) outside of the processing region.

Figure 16A:
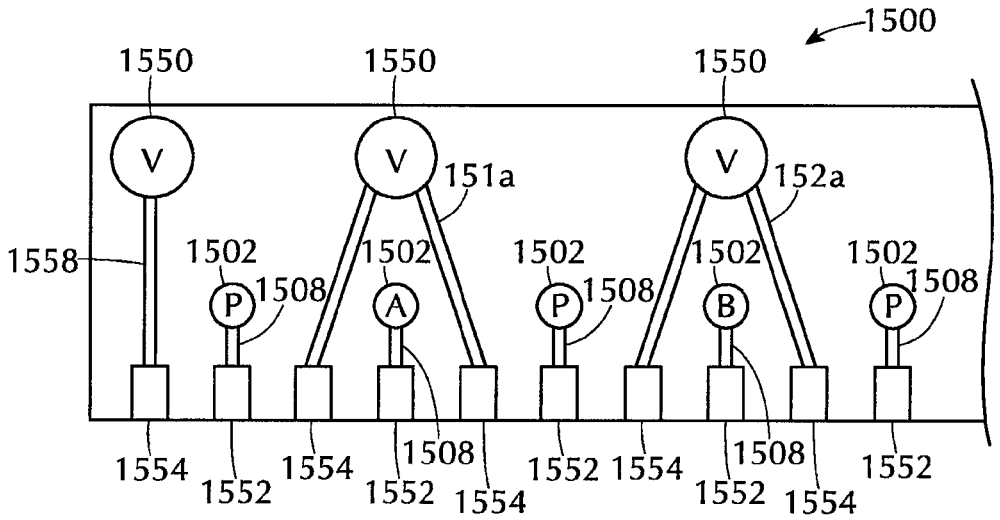
FIG. 16A shows a partial cross-sectional view of a gas distribution apparatus in accordance with one or more embodiments of the invention.
Figure 16B:
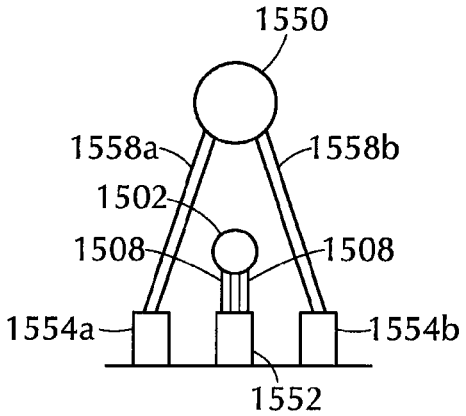
FIG. 16B shows a partial cross-sectional view of a gas distribution apparatus in accordance with one or more embodiments of the invention.

FIGS. 15, 16A and 16B show another exemplary embodiment of a gas distribution apparatus 1500. The gas distribution apparatuses shown are particularly useful for spatially separated atomic layer deposition processes in which different portions of the substrate are simultaneously exposed to different deposition gases and the substrate 1544 is moved relative to the gas distribution apparatus so that all parts of the substrate are exposed sequentially to each of the deposition gases. In these embodiments, the gas distribution apparatus 1500 comprises a plurality of delivery channels 1502, each delivery channel 1502 extending substantially straight and substantially parallel to adjacent delivery channels. Each of the delivery channels 1502 has an inlet end 1504 and an outlet end 1506 with a plurality of spaced apertures 1508 there between.

The gas distribution apparatus shown in FIGS. 15, 16A and 16B have a plurality of elongate delivery channels 1502 and a plurality of elongate vacuum channels 1550. Each of the delivery channels 1502 and vacuum channels 1550 are connected to a output channel 1552 at the front face of the gas distribution apparatus. Each of the delivery channels 1502 is adapted to flow one or more of a reactive gas and a purge gas. Each delivery channel 1502 is connected to an output channel 1552 by a plurality of spaced apertures 1508. Each of the vacuum channels 1550 is connected to an inlet channel 1554 by a plurality of spaced vacuum apertures 1558. The plurality of apertures 1508 of each delivery channel 1502 are separated from the plurality of apertures 1508 of each adjacent delivery channel 1502 by at least one plurality of vacuum apertures 1558 from a vacuum channel 1550.

In the embodiment shown in FIG. 16A, each of the central vacuum channels 1550 (not the end vacuum channels) are connected to two inlet channels 1554 by vacuum apertures 1508. The end vacuum channels 1550 are only connected to a single inlet channel 1554. It should be understood that this is merely exemplary and should not be taken as limiting the scope of the invention. Each inlet channel 1554 can have a dedicated vacuum channel 1550, or a single vacuum channel 1550 can be connected to more than two inlet channels 1554 through a plurality of vacuum apertures 1508.

While each of the delivery channels appear the same, there can be a different gas flowing through each. For example, purge channels (denoted P) may have a purge gas flowing there through, each of the first reactive gas channels (denoted A) may have a first reactive gas flowing there through and each of the second reactive gas channels (denoted B) may have a second reactive gas flowing there through. The vacuum channels (denoted V) are connected to a vacuum source. With reference to FIG. 16A, a substrate 1544 (or more specifically, a fixed point on a substrate) moving from left to right would encounter in order a vacuum gas channel, a purge gas channel, a vacuum gas channel, a first reactive gas channel, a vacuum gas channel, a purge gas channel, a vacuum gas channel, a second reactive gas channel, a vacuum gas channel, etc., depending on the size of the gas distribution plate.

The use of the delivery channels with inlet and outlet ends allows for the rapid exchange of gas within the delivery channel. For example, after the substrate (or fixed point on the substrate) is exposed to the second reactive gas channel (denoted B), the outlet end of the delivery channel can be opened, allowing the gas within the channel to be removed, and a different reactive gas (e.g., gas C) can then be flowed into the delivery channel. Thus, when the substrate passes back under that gas channel the substrate will be exposed to gas C instead of gas B. While this example has been made with respect to a second reactive gas, it will be understood by those skilled in the art that an of the gas delivery channels (first reactive gas, second reactive gas or purge gas) can be purged and replaced with a different gas.

The delivery channel of FIGS. 15, 16A and 16B can be used for plasma processing as well. The gas distribution apparatus 1500 can be biased relative to another portion of the chamber. For example, the gas distribution apparatus 1500 can be polarized relative to the pedestal, or the pedestal can be polarized relative to the gas distribution apparatus. The frequency of the plasma can be tuned as well. In one or more embodiments, the plasma is at a frequency of about 13.56 MHz. In some embodiments, the plasma is at a frequency of about 40 MHz, 50 MHz, 60 MHz, 70 MHz, 80 MHz, 90 MHz, 100 MHz, 110 MHz or 120 MHz.

FIG. 16B shows an embodiment of a single delivery channel 1502 and a single vacuum channel 1550. Each of the delivery channel 1502 and vacuum channel 1550 have two sets of apertures extending therefrom. In the case of the vacuum channel 1550, one set of apertures 1558a connect to a first inlet channel 1554a and the other set of apertures 1558b connects to a second inlet channel 1554b. The delivery channel 1502, on the other hand, has two sets of apertures 1508 extending to a single output channel 1552.

Figure 17:
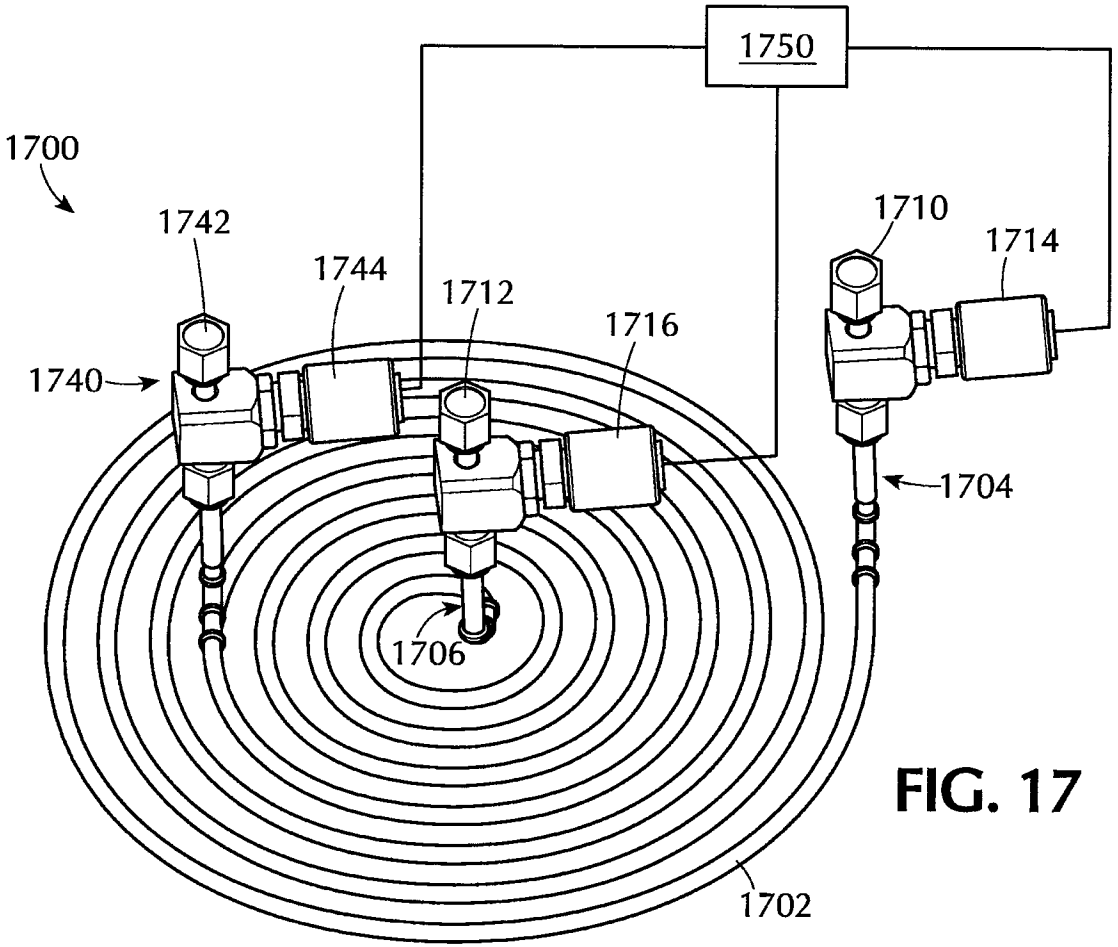
FIG. 17 shows a gas distribution apparatus in accordance with one or more embodiments of the invention.

In one or more embodiments, the gas distribution apparatus includes more than one outlet connected to a vacuum source. FIG. 17 shows a spiral shaped gas distribution apparatus 1700 which is similar to the apparatus 100 shown in FIG. 1. The apparatus includes a delivery channel 1702 with an inlet end 1704 and an outlet end 1706. An inlet 1710 is connected to and in communication with the inlet end 1704 of the delivery channel 1702. An outlet 1712 is connected to and in communication with the outlet end 1706 of the delivery channel 1702. The inlet 1710 is connectable to a gas source and may include an inlet valve 1714 that can control the flow of gas into (or out of) the delivery channel 1702 or completely cut off the flow of gas. The outlet 1712 is connectable to a vacuum source (not shown) and may include an outlet valve 1716 that can control the flow of gas out of (or into) the delivery channel 1702 or completely cut off the vacuum source from the delivery channel 1702. An intermediate outlet 1742 which is connectable to the vacuum source (not shown) is position along the length of the delivery channel 1702. The intermediate outlet 1742 shown is connected to the delivery channel 1702 at about the middle of the length of the channel 1702 and coupled to the delivery channel 1702 through an intermediate outlet 1740. The intermediate outlet 1742 may include an intermediate outlet valve 1744 that can control the flow of gas out of (or into) the delivery channel 1702 or completely cut off the vacuum source from the delivery channel 1702. The inlet valve 1714 of the inlet 1710, the outlet valve 1716 of the outlet 1712 and the intermediate outlet valve 1744 of the intermediate outlet 1740 are connected to a controller 1750. The controller is capable of independently opening or closing any or all of the valves to adjust the pressure of gases flowing through the delivery channel 1702 or purge the delivery channel 1702 of an existing gas. For example, Table 2 shows a processing sequence that may be used with the embodiment shown in FIG. 17. It will be understood by those skilled in the art that this is merely an example and should not be taken as limiting the scope of the invention.

TABLE 2

| Step | Gas Source | Intermediate Outlet valve | Outlet valve |
|---|---|---|---|
| 1a | Precursor A | Closed | Partially Open |
| 1b | Precursor A | Closed | Closed |
| 2a | Purge | Open | Closed |
| 2b | Purge | Open | Open |
| 2c | Purge | Open | Closed |
| 3a | Precursor B | Partially Open | Closed |
| 3b | Precursor B | Closed | Closed |

The valves shown in Table 2 are open, closed or partially open at any point during the processing. In Step 3a, after purging the delivery channel of Precursor A, the intermediate outlet valve is partially open to accelerate the flow of Precursor B through the delivery channel and then closed in Step 3b. This is merely one possible sequence that can be used and should not be taken as limiting the scope of the invention.

The embodiment shown in FIG. 17 effectively includes two outlets, one at the end of the delivery channel and one in the middle. Those skilled in the art will understand that there can be any number of outlets spaced along the length of the delivery channel and at any position along the length of the channel. For example, the intermediate outlet 1740 could be positioned at ⅓ of the length of the channel. Additionally, there can be any number of outlets. For example, the delivery channel may have four outlets, one at the end and one positioned at each of ¼, ½ and ¾ of the length of the delivery channel. In another example, the delivery channel includes four outlets, one at the end and one position at each of ¼, ¾ and 9/10 of the length of the delivery channel. In some embodiments, the delivery channel includes 2, 3, 4, 5, 6, 7, 8, 9, 10 or 11 total outlets (including an outlet at the outlet end of the channel).

Figure 18:
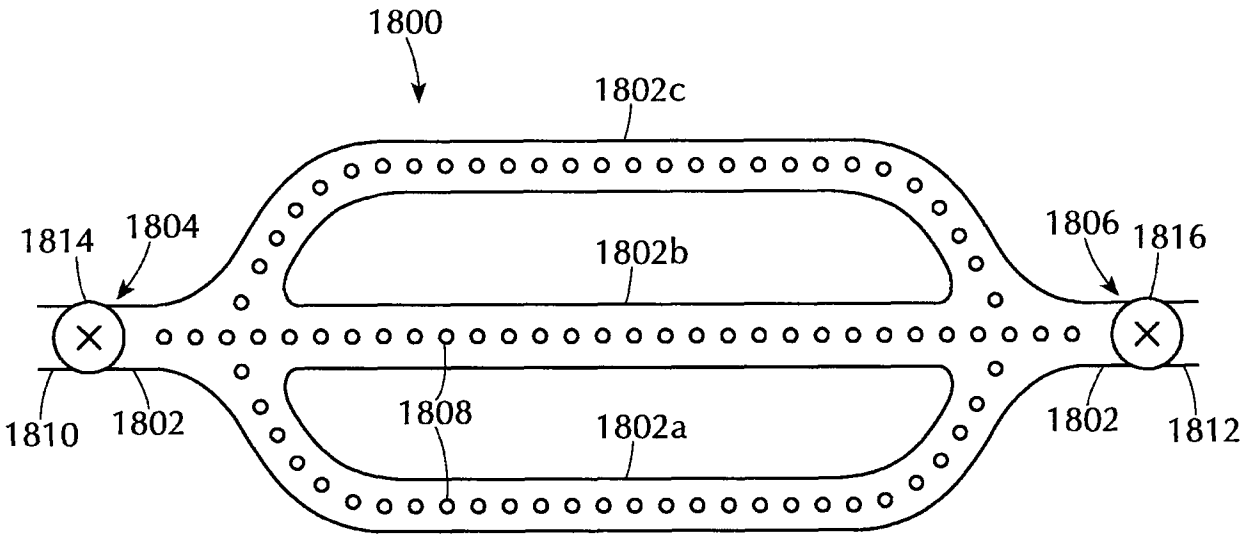
FIG. 18 shows a gas distribution apparatus in accordance with one or more embodiments of the invention.

FIG. 18 shows another embodiment of the invention in which the gas distribution apparatus 1800 includes a multipath delivery channel 1802. Here, the apparatus 1800 includes a delivery channel 1802 with an inlet end 1804 and an outlet end 1806. An inlet 1810 is connected to and in communication with the inlet end 1804 of the delivery channel 1802. An outlet 1812 is connected to and in communication with the outlet end 1806 of the delivery channel 1802. The inlet 1810 is connectable to a gas source (not shown) and may include an inlet valve 1814 that can control the flow of gas into (or out of) the delivery channel 1802 or completely cut off the flow of gas. The outlet 1812 is connectable to a vacuum source (not shown) and may include an outlet valve 1816 that can control the flow of gas out of (or into) the delivery channel 1802 or completely cut off the vacuum source from the delivery channel 1802. The delivery channel 1802 splits near the inlet end 1804 into three separate channels 1802a, 180b, 1802c and merges back into a single channel near the outlet end 1806. A plurality of apertures 1808 are spaced along the length of each of the channels so that a single gas flowing into the inlet 1810 can be directed along multiple paths and connected to a single outlet 1812. The apertures 1808 can be evenly spaced or unevenly spaced along the length of the channel 1802.

The embodiment shown splits the delivery channel into three separate channels along the length of the channel. However, it will be understood by those skilled in the art that this is merely exemplary and that the delivery channel can be split into any number of channels. In some embodiments, the delivery channel splits into 2, 3, 4, 5, 6, 7, 8, 9 or 10 separate delivery channels. Additionally, the delivery channel can split multiple time along the length of the channel. For example, the channel can split into two, merge into one and then split into 3 along the length of the channel.

Figure 19:
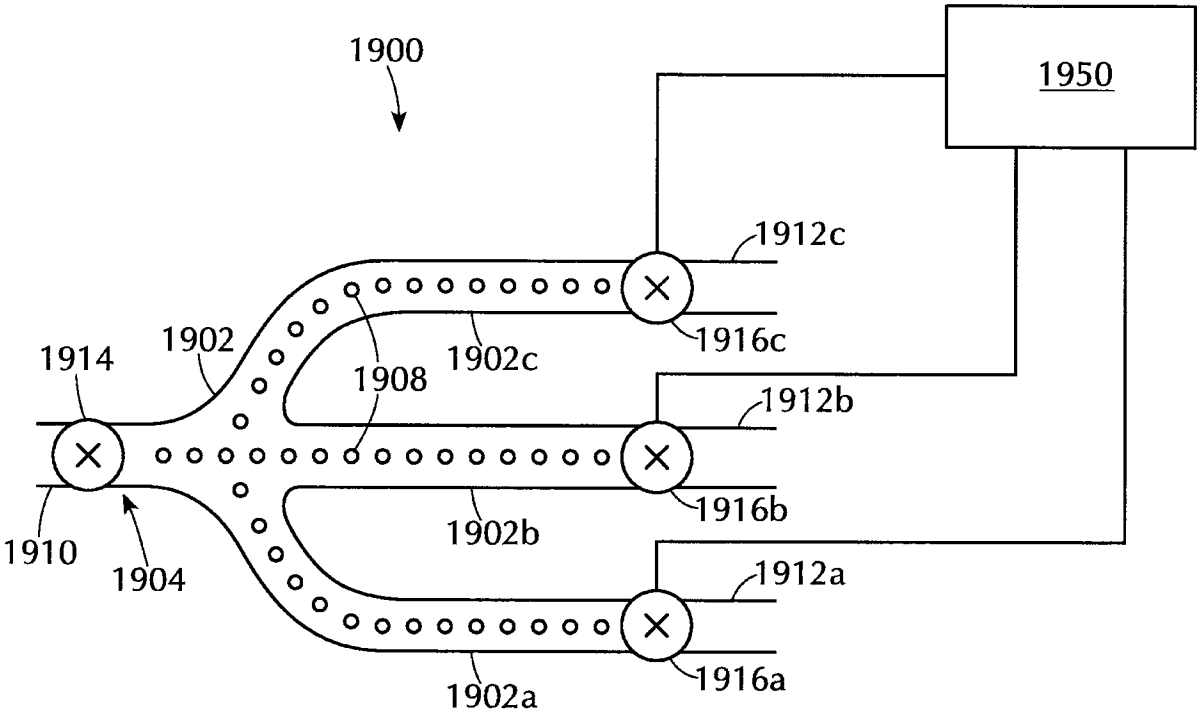
FIG. 19 shows a gas distribution apparatus in accordance with one or more embodiments of the invention.

The flow of gas through the multi-channel gas distribution apparatus shown in FIG. 18 may not be uniform among the three channels. The uniformity of gas flow between the channels can be affected by a number of factors including, but not limited to, gas pressure, vacuum pressure, temperature, flow rate and from static pressure drops along the length. FIG. 19 shows another embodiment of a gas distribution apparatus 1900 in which the delivery channel 1902 splits into three separate channels 1902a, 1902b, 1902c each with its own outlet valve 1912a, 1912b, 1912c. The apparatus 1900 shown includes an inlet end 1904 connected through an inlet valve 1914 to an inlet 1910. The delivery channel 1902 includes a plurality of apertures 1908 spaced along the length of each of the separate channels 1902a, 1902b, 1902c. The apertures can be evenly spaced or unevenly spaced along the length of the channels. Each channel has a separate outlet 1912a, 1912b, 1912c with separate outlet valves 1916a, 1916b, 1916c. Each of the outlet valves 1916a, 1916b, 1916c is connected to a controller 1950 that can independently control each of the outlet valves 1916a, 1916b, 1916c. In this embodiments, the controller 1950 can set the outlet valves to closed, fully open, or at any point in between. For example, if the flow of gas through one of the channels is lower than the others, the controller 1950 may open the outlet valve of that channel to accelerate the flow or may open the outlet valves of the other channels to accelerate flow and cause less gas to exit the channels through the apertures to cause a more uniform flow.

Figure 20:
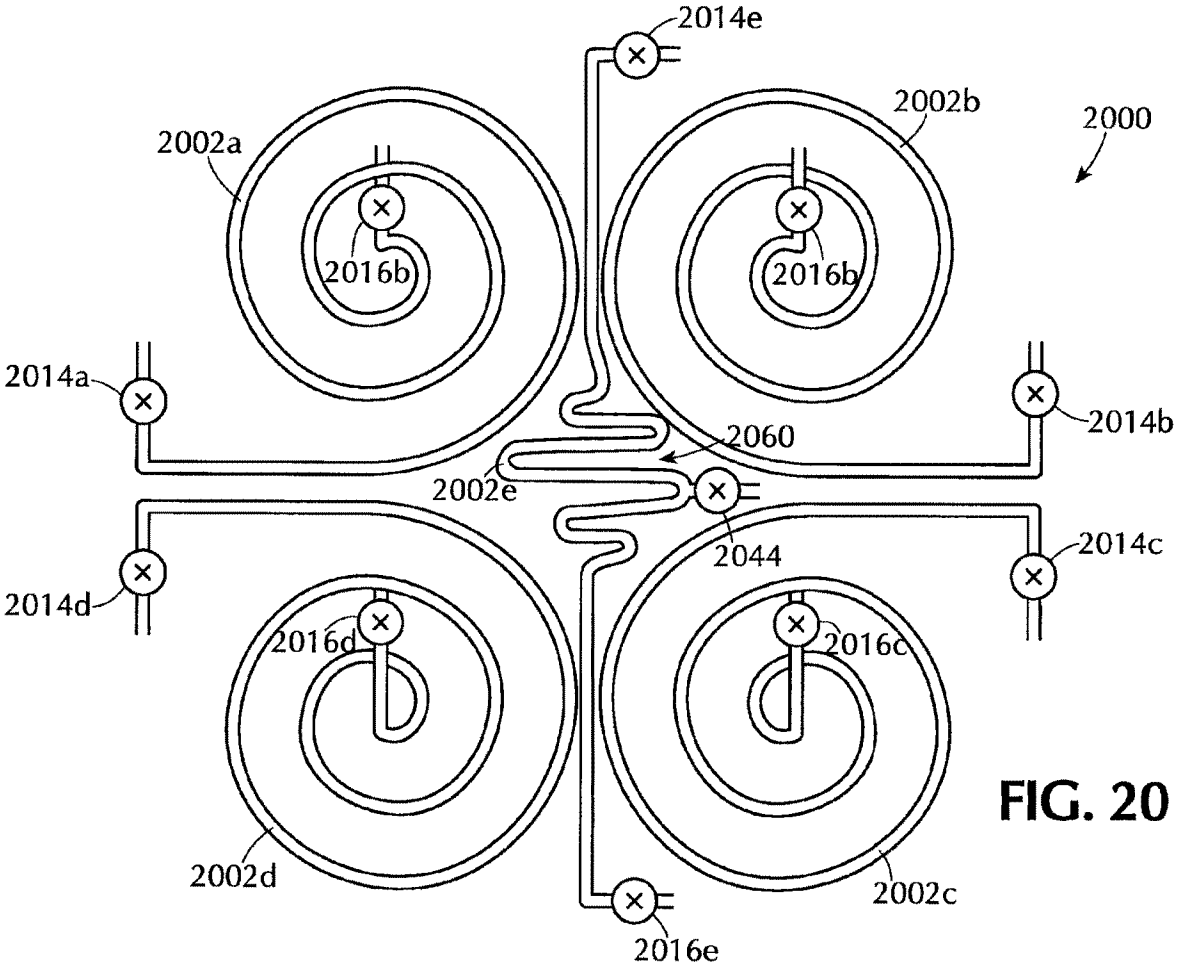
FIG. 20 shows a gas distribution apparatus in accordance with one or more embodiments of the invention.

Multiple separate channels can also be employed. FIG. 20 shows an embodiment of a gas distribution apparatus 2000 with five separate gas delivery channels 2002a, 2002b, 2002c, 2002d, 2002e. Each of the delivery channels 2002a, 2002b, 2002c, 2002d, 2002e includes an inlet valve 2014a, 2014b, 2014c, 2014d, 2014e and an outlet valve 2016a, 2016b, 2016c, 2016d, 2016e. Four spiral shaped delivery channels 2002a-d are shown leaving a void area 2060 at the center of the four channels. The fifth delivery channel 2002e passes between the spirals and oscillates in the void area 2060 to prevent dead space in the gas flow. The fifth delivery channel 2002e is shown with an intermediate outlet valve 2044. Each of the delivery channels can be configured to deliver the same gas, or can deliver separate gases.

In one embodiment, the five channels cover a single substrate and each channel delivers the same reactive gas. The substrate may be rotated beneath the delivery channels, or the channels may rotate or oscillate over the substrate. In another embodiment, alternative delivery channels (e.g., 2002a, 2002c) can deliver a first reactive gas and the other channels (e.g., 2002b, 2002d) can deliver a second reactive gas. The fifth channel 2002e can be configured to deliver an inert gas to form a curtain between the separate channels to separate the gases and prevent gas-phase reactions. Rotating the substrate beneath these channels would expose alternating quarters to the same gas followed by the second reactive gas to deposit a film. In this embodiment, the portion of the substrate in the void area 2060 would not have a deposited layer.

In another embodiment, each of the channels can deliver the same gas but be sized so that a single substrate would be covered by a single delivery channel allowing the processing of multiple substrates by moving the substrates from one delivery channel to the adjacent channel. Each channel can be configured to deliver the same gas or separate gases and the fifth channel can be configures to deliver an inert gas to form a curtain separating the reaction regions adjacent the delivery channels. The fifth delivery channel, and any other gas delivery channel described herein can have multiple inlets and a single outlet, or multiple outlets. For example the fifth delivery channel shown may have an inlet at either end and a single outlet in the middle to create a stronger gas curtain to separate the other delivery channels.

Figure 21:
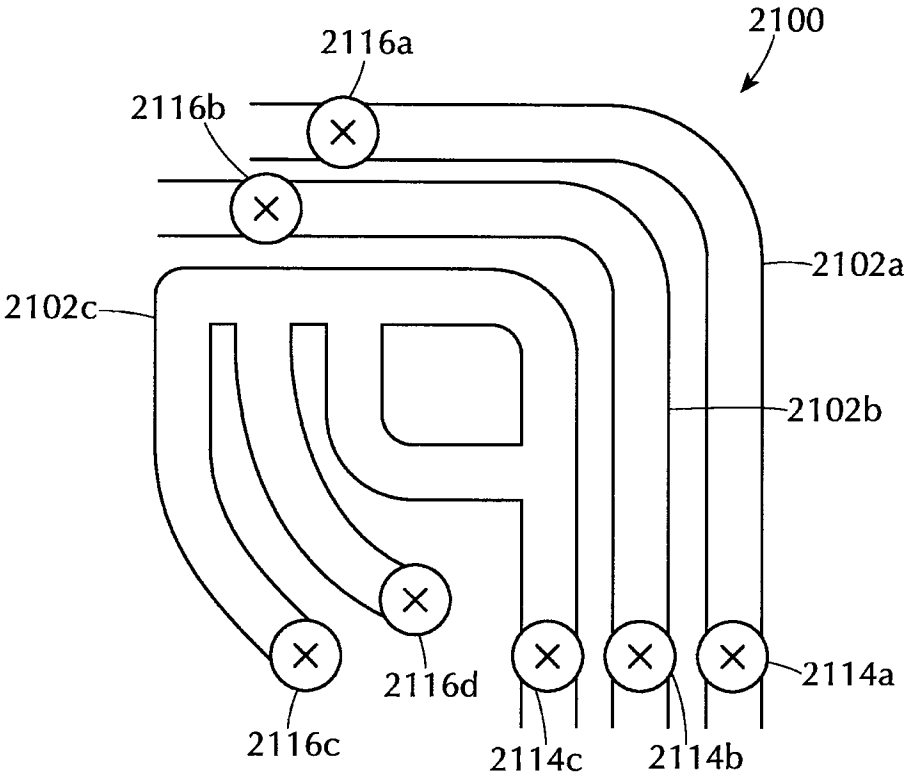
FIG. 21 shows a gas distribution apparatus in accordance with one or more embodiments of the invention.

Again, the shape and number of outlets can vary depending on the desired use. The spiral shape shown in FIG. 20 is merely exemplary and should not be taken as limiting the scope of the invention. The shape of the gas delivery channel(s) can be modified for a number of reasons. In some embodiments, the gas delivery channel is shaped for spell words (e.g., "Applied Materials") or form a logo. For example, FIG. 21 shows three delivery channels 2102a, 2102b, 2102c roughly forming the logo of Applied Materials, Inc. of Santa Clara, Calif. The first gas delivery channel 2102a and second gas delivery channel 2102b each have a single inlet valve 2114a, 2114b and a single outlet valve 2116a, 2116b. The third gas delivery channel 2102c has a single inlet valve 2114c and two outlet valves 2116c, 2116d. Along the length, the third gas delivery channel 2102c splits into two channels, reforms into a single channel and then splits into two channels again. In another embodiment, inlet valves and outlet valves of the third delivery channel are reversed so that there are two inlet valves and a single outlet valve.

Figure 22B:
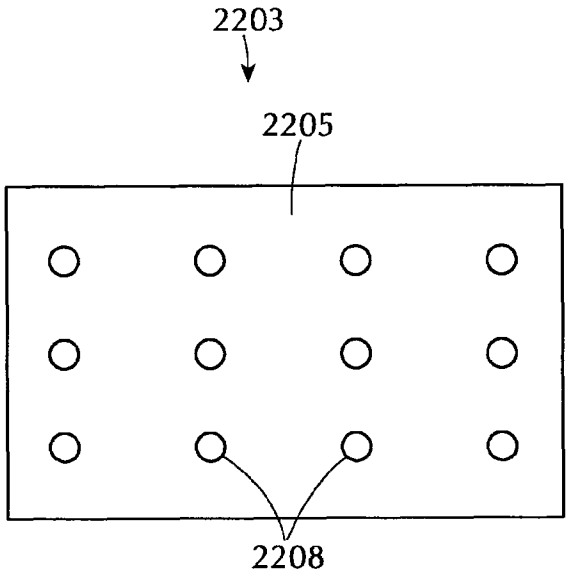
FIG. 22B shows the front side of the gas distribution apparatus of FIG. 22A.
Figure 22A:
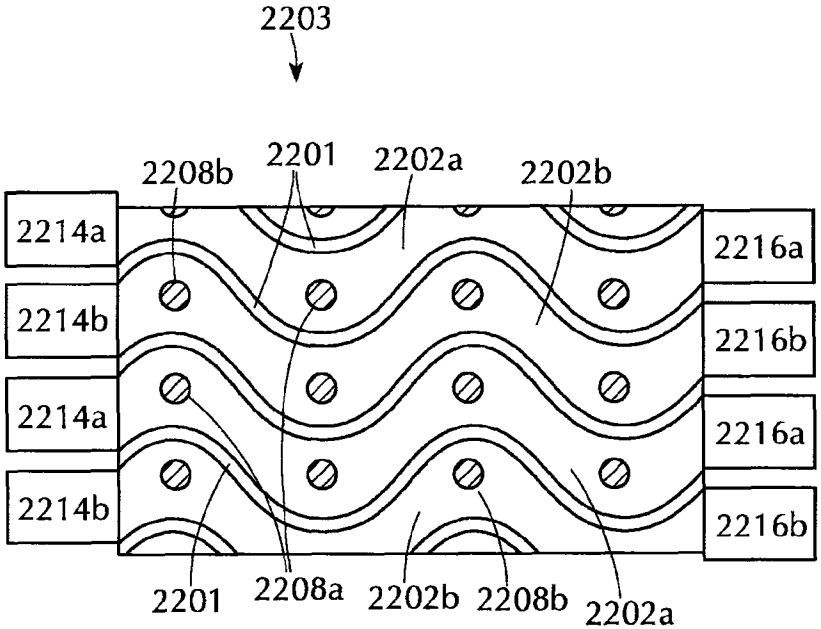
FIG. 22A shows a portion of a back side of a gas distribution apparatus in accordance with one or more embodiments of the invention.

The gas flows coming from the surface of the gas distribution apparatus seen by the substrate can be uniform or striated. For example, a substrate passing beneath the dual spiral gas distribution apparatus shown in FIG. 9 will see alternating rings of gases. In some embodiments, the plurality of delivery channels are shaped so that the hole pattern seen by a substrate is uniform across the gas distribution apparatus. FIGS. 22A and 22B show part an embodiment of a gas distribution apparatus 2203 in which the gas flows seen by a substrate would be uniform. FIG. 22A shows the back side 2201 of a gas distribution apparatus 2203 with a plurality of alternating gas channels 2202a, 2202b. The gas channels 2202a, 2202b undulate with the holes 2208a, 2208b spaced along the length of the gas channels so that hole 2208 pattern seen on the front side 2205 in FIG. 22B is uniform. Additionally, the gas flows seen by the substrate are uniform because there is a uniform distribution of holes across the gas distribution apparatus front. Looking at FIG. 22B, the top row of holes 2208 would alternate between the first gas and the second gas, with the next row having the reverse pattern. Thus, of the twelve holes 2208 shown, the first gas will flow out of six of the holes and the second gas will flow out of the other six holes.

There can be multiple inlet valves 2214a, 2214b, as shown in FIG. 22A, or can be a single valve split into multiple channels. Additionally, there can be multiple outlet valves 2216a, 2216b, as shown in FIG. 22B, or there can be a single outlet valve joining each of the channels.

The gas distribution apparatus described can be used to form one or more layers during a plasma enhanced atomic layer deposition (PEALD) process. In some processes, the use of plasma provides sufficient energy to promote a species into the excited state where surface reactions become favorable and likely. Introducing the plasma into the process can be continuous or pulsed. In some embodiments, sequential pulses of precursors (or reactive gases) and plasma are used to process a layer. In some embodiments, the reagents may be ionized either locally (i.e., within the processing area) or remotely (i.e., outside the processing area). Remote ionization can occur upstream of the deposition chamber such that ions or other energetic or light emitting species are not in direct contact with the depositing film. In some PEALD processes, the plasma is generated external from the processing chamber, such as by a remote plasma generator system. The plasma may be generated via any suitable plasma generation process or technique known to those skilled in the art. For example, plasma may be generated by one or more of a microwave (MW) frequency generator or a radio frequency (RF) generator. The frequency of the plasma may be tuned depending on the specific reactive species being used. Suitable frequencies include, but are not limited to, 2 MHz, 13.56 MHz, 40 MHz, 60 MHz and 100 MHz. Although plasmas may be used during the deposition processes disclosed herein, it should be noted that plasmas may not be required.

According to one or more embodiments, the gas distribution apparatus can be used to subject a substrate to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the desired separate processing chamber. Accordingly, the processing apparatus may comprise multiple chambers in communication with a transfer station. An apparatus of this sort may be referred to as a "cluster tool" or "clustered system", and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura® and the Endura®, both available from Applied Materials, Inc., of Santa Clara, Calif. The details of one such staged-vacuum substrate processing apparatus is disclosed in U.S. Pat. No. 5,186,718, entitled "Staged-Vacuum Wafer Processing Apparatus and Method," Tepman et al., issued on Feb. 16, 1993. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants after forming the silicon layer on the surface of the substrate. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

A substrate can be processed in single substrate deposition chambers using, for example, the gas distribution apparatus described. In such chambers, a single substrate is loaded, processed and unloaded before another substrate is processed. A substrate can also be processed in a continuous manner, like a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposure to different reactive or purge gases. Rotating the substrate during processing (either continuously or in steps) may help produce a more uniform deposition or etch by minimizing the effect of, for example, local variability in gas flow geometries.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A gas distribution apparatus for controlling flow of gas into a process chamber, comprising:

a spiral delivery channel having an inlet end, an outlet end and a length, the delivery channel having a plurality of apertures spaced along the length;

an inlet on the inlet end of the delivery channel, the inlet connectable to a gas source, wherein flow of the gas is controllable by a gas valve in communication with the inlet; and an outlet on the outlet end of the delivery channel, the outlet connectable to a vacuum source, wherein vacuum pressure through the outlet is controllable by an outlet valve to provide a reduced pressure at the outlet; and a controller to regulate the flow of the gas through the delivery channel and into the process chamber by opening and closing the outlet valve during gas delivery and gas purging in the channel to control the flow of gas through the apertures along the length of the channel.

2. The gas distribution apparatus of claim 1, wherein a flow of gas through the gas distribution apparatus has a more uniform conductance along an axial length of the gas distribution apparatus than the flow of gas through a similar gas distribution apparatus without the vacuum source connected to the outlet.

3. The gas distribution apparatus of claim 1, wherein when the gas valve is closed, the gas is purged from the delivery channel faster than a similar gas distribution apparatus without the vacuum source.

4. The gas distribution apparatus of claim 1, wherein the delivery channel is a recessed channel in a back side of a gas distribution plate and the plurality of apertures extend through the gas distribution plate to a front side of the gas distribution plate.

5. The gas distribution apparatus of claim 4, wherein the gas distribution plate is round and the delivery channel forms a spiral shape with one of the inlet end and outlet end positioned in an outer peripheral region of the gas distribution plate and the other of the inlet end and outlet end positioned in a central region of the gas distribution plate.

6. The gas distribution apparatus of claim [3] *4*, wherein the inlet end is positioned at an outer peripheral region of the gas distribution plate and the outlet end is positioned at a central region of the gas distribution plate.

7. The gas distribution apparatus of claim [3] *4*, wherein the outlet end is positioned at an outer peripheral region of the gas distribution plate and the inlet end is positioned at a central region of the gas distribution plate.

8. The gas distribution apparatus of claim 4, wherein there are two delivery channels recessed in the back side of the gas distribution plate.

9. The gas distribution apparatus of claim 8, wherein each of the delivery channels forms a spiral shape with one of the inlet end and outlet end positioned in an outer peripheral region of the gas distribution plate and the other of the inlet end and outlet end positioned in a central region of the gas distribution plate.

10. The gas distribution apparatus of claim 9, wherein the two delivery channels are intertwined along the spiral shape.

11. The gas distribution apparatus of claim 9, wherein each delivery channel has the inlet end positioned in the outer periphery region of the gas distribution plate and the outlet end positioned in the central region of the gas distribution plate.

12. The gas distribution apparatus of claim 9, wherein each delivery channel has the outlet end positioned in the outer periphery region of the gas distribution plate and the inlet end positioned in the central region of the gas distribution plate.

13. The gas distribution apparatus of claim 9, wherein inlet end of one delivery channel is positioned in the outer periphery region of the gas distribution plate and the outlet end of the other delivery channel is positioned in the outer periphery region of the gas distribution plate.

14. The gas distribution apparatus of claim 4, further comprising a back cover on the back side of the gas distribution plate, the back cover covering the recessed channel.

15. The gas distribution apparatus of claim 1, wherein the delivery channel is a tubular spiral having a substantially planar shape.

16. The gas distribution apparatus of claim 15, wherein the gas distribution apparatus comprises a plurality of delivery channels.

17. The gas distribution apparatus of claim 16, wherein more than one of the delivery channels are connected to the inlet so that a gas flowing through the inlet flows through each of the delivery channels.

18. The gas distribution apparatus of claim 17, wherein each of the delivery channels connected to the inlet merge and are connected to one outlet.

19. The gas distribution apparatus of claim 17, wherein each of the delivery channels connected to the inlet has a separate outlet connected to a separate outlet valve.

20. The gas distribution apparatus of claim 19, wherein the controller independently adjusts each of the outlet valves to maintain a substantially uniform flow of gas through each of the delivery channels.

21. The gas distribution apparatus of claim 16, wherein the plurality of delivery channels are shaped so that [the] *a* hole pattern seen by a substrate is uniform across the gas distribution apparatus.

22. A processing chamber comprising the gas distribution apparatus of claim 1.

23. The processing chamber of claim 22, wherein the gas distribution apparatus comprises a tubular spiral having a substantially planar shape, the gas distribution apparatus positioned between a substrate support and a gas distribution plate.

24. A gas distribution apparatus, comprising:

a spiral gas delivery channel recessed in a back side of a gas distribution plate, the recessed gas delivery channel having an inlet end, an outlet end and a length, the gas delivery channel having a plurality of apertures spaced along the length extending through the gas distribution plate to a front side of the gas distribution plate so that gas flowing through the gas delivery channel can pass through the apertures exiting the gas distribution plate;

a back cover on the back side of the gas distribution plate, the back cover covering the recessed channel;

an inlet connected to the inlet end of the gas delivery channel through the back cover, the inlet connectable to a gas source, wherein a flow of gas is controllable by a gas valve in communication with the inlet;

an outlet connected to the outlet end of the gas delivery channel through the back cover, the outlet connectable to a vacuum source, wherein vacuum pressure through the outlet is controllable by an outlet valve to provide a reduced pressure at the outlet; and a controller to regulate the flow of the gas through the gas delivery channel and into a process chamber by opening and closing the outlet valve during gas delivery and gas purging to control the flow of gas through the apertures along the length of the channel.

25. The gas distribution apparatus of claim 24, wherein the gas distribution plate is round and the delivery channel forms a spiral shape with one of the inlet end and outlet end positioned in an outer peripheral region of the gas distribution plate and the other of the inlet end and outlet end positioned in a central region of the gas distribution plate.

26. The gas distribution apparatus of claim 25, wherein there are two delivery channels recessed in the back side of the gas distribution plate, the two delivery channels intertwined along the spiral shape.

*27. A gas distribution apparatus, comprising:*

*a plate having a front surface and a back surface;*

*a first recessed channel formed in the back surface of the plate and extending from a central region of the back surface to an outer peripheral region of the back surface;*

*a second recessed channel formed in the back surface of the plate and extending from the central region of the back surface to the outer peripheral region of the back surface;*

*a first plurality of apertures along the first recessed channel, each of the first plurality of apertures extending through the plate from the front surface to the first recessed channel; and*

*a second plurality of apertures along the second recessed channel, each of the second plurality of apertures extending through the plate from the front surface to the second recessed channel, wherein*

*the first recessed channel and the second recessed channel are intertwined, and*

*a surface of the first recessed channel and a surface of the second recessed channel each further comprise an upper portion that is disposed between a lower portion and the back surface, and the lower portion having a rounded shape.*

*28. The gas distribution apparatus of claim 27, wherein the rounded shape is a half-round shape or a half-elliptical shape.*

*29. The gas distribution apparatus of claim 27, wherein the first plurality of apertures extends from the lower portion of the surface of the first recessed channel to the front surface.*

*30. The gas distribution apparatus of claim 29, wherein the second plurality of apertures extends from the lower portion of the surface of the second recessed channel to the front surface.*

*31. The gas distribution apparatus of claim 27, wherein each aperture of the first plurality of apertures and the second plurality of apertures comprises a first section having a first diameter, a second section, and a third section that has a second diameter, wherein the second section is between the first and third sections and has a shape that tapers from the first diameter to the second diameter.*

* * * * *